US009006435B2

(12) United States Patent
Koch

(10) Patent No.: US 9,006,435 B2
(45) Date of Patent: Apr. 14, 2015

(54) ELECTROLUMINESCENT THIOPHENE DERIVATIVES

(75) Inventor: Gene Carl Koch, Pontypridd (GB)

(73) Assignee: Lomox Limited, Wilmslow (GB)

( * ) Notice: Subject to any disclaimer, the term of this patent is extended or adjusted under 35 U.S.C. 154(b) by 0 days.

(21) Appl. No.: 13/499,001

(22) PCT Filed: Sep. 29, 2010

(86) PCT No.: PCT/GB2010/001817
§ 371 (c)(1),
(2), (4) Date: Jul. 3, 2012

(87) PCT Pub. No.: WO2011/039505
PCT Pub. Date: Apr. 7, 2011

(65) Prior Publication Data
US 2012/0271052 A1 Oct. 25, 2012

(30) Foreign Application Priority Data
Sep. 30, 2009 (GB) .................................. 0917087.9

(51) Int. Cl.
C07D 495/04 (2006.01)
C07D 333/54 (2006.01)
C09K 11/06 (2006.01)
C08G 61/12 (2006.01)
H01L 51/00 (2006.01)
H01L 51/50 (2006.01)

(52) U.S. Cl.
CPC .............. C09K 11/06 (2013.01); C08G 61/122 (2013.01); C08G 61/126 (2013.01); H01L 51/0074 (2013.01); C08G 2261/141 (2013.01); C08G 2261/1642 (2013.01); C08G 2261/1644 (2013.01); C08G 2261/226 (2013.01); C08G 2261/3241 (2013.01); C08G 2261/3243 (2013.01); C08G 2261/5222 (2013.01); C09K 2211/1416 (2013.01); C09K 2211/1425 (2013.01); C09K 2211/1458 (2013.01); C09K 2211/1466 (2013.01); H01L 51/004 (2013.01); H01L 51/0058 (2013.01); H01L 51/0068 (2013.01); H01L 51/0072 (2013.01); H01L 51/5012 (2013.01)

(58) Field of Classification Search
CPC ... C07D 241/38; C07D 333/54; C07D 495/04
USPC ......................................................... 544/342
See application file for complete search history.

(56) References Cited

U.S. PATENT DOCUMENTS

| 4,983,324 | A | 1/1991 | Durr et al. |
| 7,118,787 | B2 | 10/2006 | O'Neill et al. |
| 8,263,735 | B2 | 9/2012 | Kitano et al. |
| 2003/0021913 | A1 | 1/2003 | O'Neill et al. |
| 2003/0099785 | A1 | 5/2003 | O'Neill et al. |
| 2005/0040396 | A1 | 2/2005 | O'Neill et al. |
| 2005/0116199 | A1 | 6/2005 | Kelly et al. |
| 2005/0147846 | A1 | 7/2005 | Marks et al. |
| 2006/0046092 | A1 | 3/2006 | Towns et al. |
| 2007/0134511 | A1 | 6/2007 | Kawamura et al. |
| 2007/0195576 | A1 | 8/2007 | Imada et al. |
| 2008/0248220 | A1 | 10/2008 | Sekine et al. |
| 2011/0015404 | A1 | 1/2011 | Koch |

FOREIGN PATENT DOCUMENTS

| CN | 1711301 | A | 12/2005 | |
| CN | 101085916 | | 12/2007 | |
| CN | 101333162 | | 12/2008 | |
| EP | 1394188 | | 3/2004 | |
| EP | 1598387 | | 11/2005 | |
| GB | 2456298 | | 7/2009 | |
| GB | 2456298 | A | * 7/2009 | ........... C07D 333/16 |
| JP | 2001166519 | | 6/2001 | |
| JP | 2002040686 | | 2/2002 | |
| JP | 2004212959 | | 7/2004 | |
| JP | 2005206750 | | 8/2005 | |
| JP | 2009124064 | | 6/2009 | |
| WO | 9749548 | | 12/1997 | |
| WO | 2004041901 | | 5/2004 | |
| WO | 2004093154 | | 10/2004 | |
| WO | 2005001952 | | 1/2005 | |
| WO | 2005034184 | | 4/2005 | |
| WO | 2005095543 | | 10/2005 | |
| WO | 2005121150 | | 12/2005 | |
| WO | 2006058182 | | 6/2006 | |
| WO | 2006058266 | | 6/2006 | |
| WO | 2006058267 | | 6/2006 | |
| WO | 2006060294 | | 6/2006 | |
| WO | 2006131185 | | 12/2006 | |
| WO | 2007064721 | | 6/2007 | |

(Continued)

OTHER PUBLICATIONS

Perepichka, Igor. Thiophene-based Materials for Electroluminescent Applications, in Handbook of Thiophene-Based Materials: Applications in Organic Electronics and Photonics, (2009), 695-756, John Wiley & Sons, Ltd, Chichester, UK.*
International Search Report for PCT/GB2010/001817, Completed by the European Patent Office on Jan. 20, 2011, 3 Pages.
Aldred et al. Advanced Materials 2005, vol. 17, p. 1368-1372, "A Full-Color Electroluminescent Device and Patterned Photoalignment Using Light-Emitting Liquid Crystals.".
Aldred et al. Journal of Materials Chemistry 2005, vol. 15, p. 3208-3213, "Linearly polarised organic light-emitting diodes (OLEDs): synthesis and characterisation of a novel hole-transporting photoalignment copolymer.".
Yu et al. Chinese Journal of Polymer Science 2001, vol. 19, No. 6, p. 603-613, "Fluorene-Based Light-Emitting Polymers.".

(Continued)

Primary Examiner — Golam M M Shameem
Assistant Examiner — Laura Daniel
(74) Attorney, Agent, or Firm — Dority & Manning, P.A.

(57) ABSTRACT

LED compounds of the general structure: (B-S-)n-A-(-S-B)m (Structure 1); wherein the rod-like molecular nucleus A having the structure: -Ar(-T-Ar)p- (Structure 2); wherein T includes a diradical.

18 Claims, No Drawings

(56) References Cited

FOREIGN PATENT DOCUMENTS

| | | |
|---|---|---|
| WO | 2009087364 | 7/2009 |
| WO | 2009103952 | 8/2009 |

OTHER PUBLICATIONS

Contoret et al. Chem. Mater. 2002, vol. 14, p. 1477-1487, "The Photopolymerization and Cross-Linking of Electroluminescent Liquid Crystals Containing Methacrylate and Diene Photopolymerizable End Groups for Multilayer Organic Light-Emitting Diodes.".

Decker et al. Polymer 1997, vol. 38, No. 9, p. 2229-2237, "Photoinitiated radical polymerization of vinyl ether-maleate systems.".

Vak et al. Macromolecules 2006, vol. 39, p. 6433-6439, "Synthesis and Characterization of Spiro-Triphenylamine Configured Polyfluroene Derivatives with Improved Hole Injection.".

Loy et al. Advanced Functional Materials Apr. 2002, vol. 12, No. 4, p. 245-249, "Thermally Stable Hole-Transporting Materials Based upon a Fluorene Core.".

Goel et al. Org. Lett. 2009, vol. 11, p. 1289-1292, "Donor-Acceptor 9-Uncapped Fluorenes and Fluorenones as Stable Blue Light Emitters.".

Lee et al. Macromolecular Chemistry and Physics 2004, vol. 205, p. 2245-2251, "Novel Photo-Alignment Polymer Layer Capable of Charge Transport.".

Kohli et al. Macromolecules 1998, vol. 31, p. 5681-5689, "Co-Polymerization of Maleimides and Vinyl Ethers: A Structural Study.".

Neilson et al. Polymer Preprints 2005, vol. 46, No. 2, p. 653-654, "Synthesis and Properties of Periluorocyclobutyl (PFCB) Polymers for Light Emission.".

\* cited by examiner

ELECTROLUMINESCENT THIOPHENE DERIVATIVES

CROSS-REFERENCE TO RELATED APPLICATION

This application is the U.S. national phase of PCT Appln. No. PCT/GB2010/001817 filed on Sep. 29, 2010, which claims priority to GB application 0917087.9 filed on Sep. 30, 2009, the disclosures of which are incorporated in their entirety by reference herein.

This invention relates to electroluminescent materials.

It is known that some reactive mesogens (liquid crystalline materials capable of being chemically crosslinked into a polymer matrix) of the general formula:

B-S-A-S-B where A represents a linear aromatic molecular core, S represents flexible spacer units and B represents crosslinking groups such as methacrylate groups, may be useful in the fabrication of organic electronic devices. This is particularly the case if B represents photocrosslinkable groups, since then the materials function essentially as photoresists, which is to say, thin layers of these materials may be patterned into useful electronic structures by patterned exposure to light, particularly UV light.

Further, if the a linear aromatic core A is luminescent in nature, these reactive mesogens materials may be patterned into the active light emitting layers in electroluminescent devices such as organic light emitting diodes (OLEDS) and organic diode lasers.

An important aspect in the development of reactive mesogen materials for display applications is that red, green, and blue emitting materials all need to be developed so as to allow the fabrication of full-colour dot-matrix displays that consist of pixels that in turn consist of triads of red, green, and blue electronically addressable elements. Materials of the formula B-S-A-S-B in which the molecular core is completely carbocyclic in nature emit light in the violet to blue portion of the visible spectrum because of the comparatively low polarisability of the carbon-hydrogen and carbon-carbon bonds in these materials. To produce materials with longer wavelength light emission it is necessary to introduce more polarisable auxochromic functional units into the backbone of the linear molecular core. Thiophene rings have been found particularly useful for this purpose since thiophene itself is a highly stable material because of its high degree of aromaticity and also since the sulphur atom imparts substantially higher electrical polarisability.

Adding a single thiophene diradical into the molecular backbone, e.g.

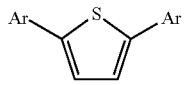

(where the two Ar substituents represent the remainder of the molecular core) shifts the luminescence wavelength in the red direction, but not sufficiently to convert a blue emitter to a green one. In a prior art invention it was found that adding two pairs of thiophene rings to the molecular backbone, e.g.

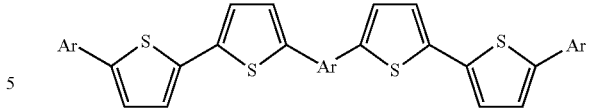

does shift blue luminescent emission into the green.

A problem with this approach is that there is free rotation about the single bonds between the thiophene rings causing the emitter molecule to be less rigid and rod-like. This destabilises the liquid crystalline phase of the materials. Also, this same rotational freedom tends to favour the formation of glassy rather than crystalline solid phases. Glassy materials are much more difficult to ultrapurify for electronic applications than are materials with crystalline solid phases.

A prior art attempt at solving this problem was to fuse two thiophene rings together to form the thieno[3,2-b]thiophene ring structure.

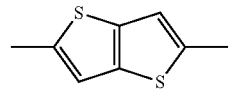

If two of these units are included in the molecular backbone:

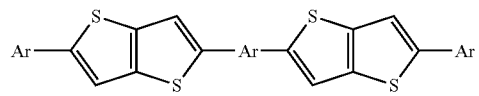

the stability of the liquid crystalline phase and the crystallinity of the solid phase are enhanced. Furthermore, because single bonds have been eliminated from the molecular backbone, the luminescent efficiency of the materials is enhanced. Another advantage of this approach is that there is the potential for even greater emission wavelength red shifts by fusing even more thiophene rings onto the thieno[3,2-b]thiophene ring structure yielding, for example:

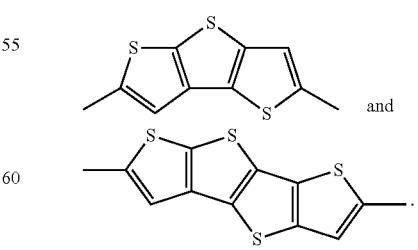

However, when these materials were first made in the literature it was found that the two examples shown above both decompose on heating. This casts serious doubt on the stability of thienothiophene-based materials in electronic applications.

The invention comprises OLED compounds of the general structure:

(B-S-)$_n$-A-(-S-B)$_m$  Structure 1 wherein the rod-like molecular nucleus A comprises the structure:

—Ar(-T-Ar)$_p$—  Structure 2 wherein T may be chosen from the following diradicals:

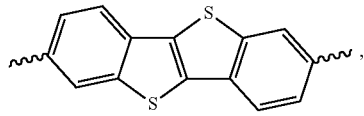

Structure 3

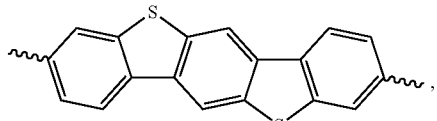

Structure 4

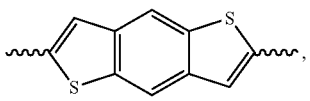

Structure 5

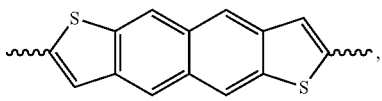

Structure 6

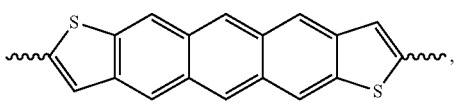

Structure 7

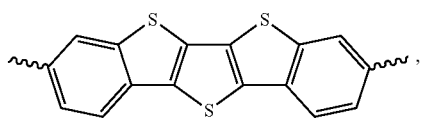

Structure 8

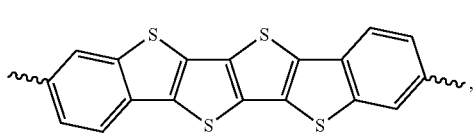

Structure 9

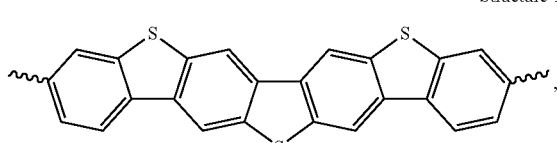

Structure 10

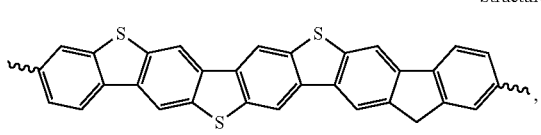

Structure 11

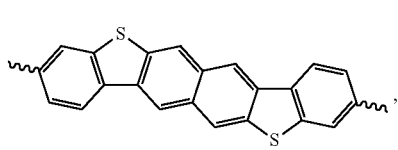

Structure 12

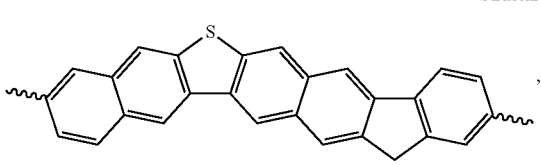

Structure 13

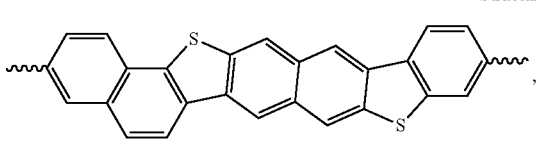

Structure 14

Structure 15

Structure 16

Structure 17

Structure 18

Structure 19

Structure 20

-continued
Structure 21
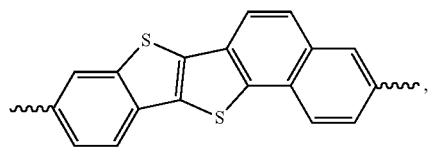
Structure 22
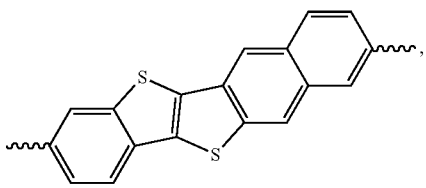
Structure 23
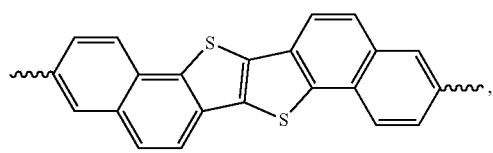
Structure 24
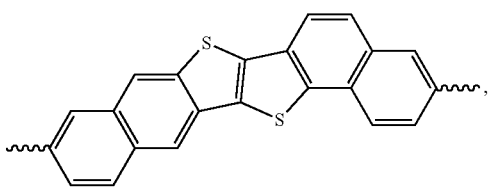
Structure 25
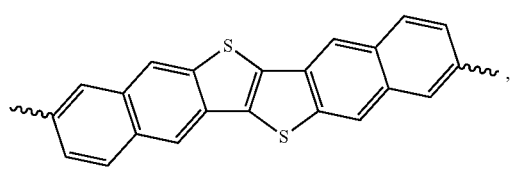
Structure 26
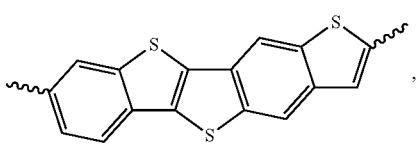
Structure 27
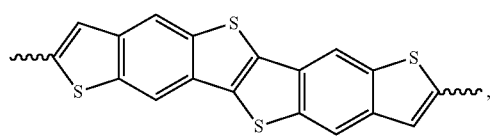
Structure 28
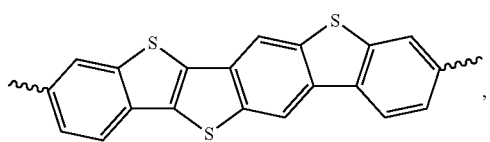
Structure 29
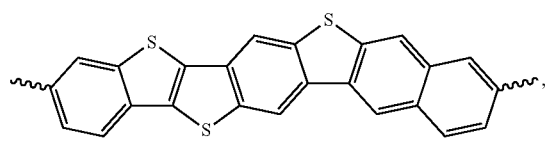
Structure 30
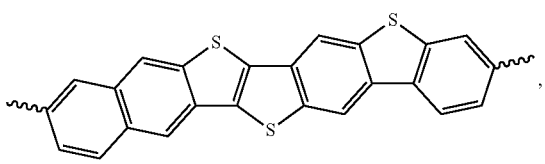
Structure 31
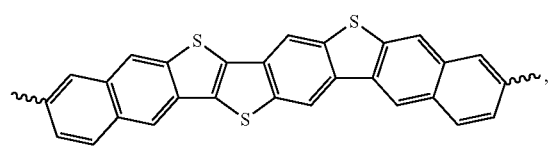
Structure 32
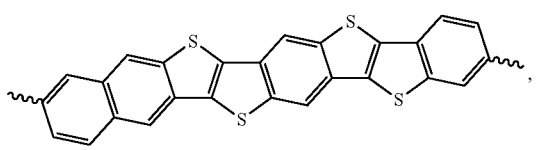
Structure 33
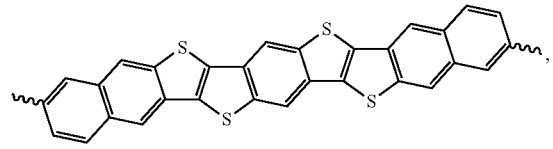
Structure 34
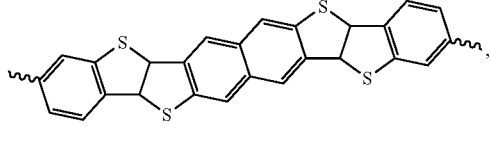
Structure 35
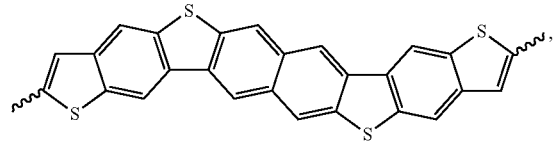
Structure 36
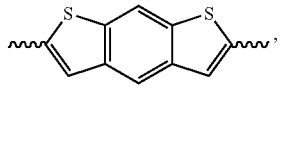
Structure 37
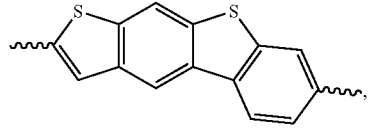
Structure 38
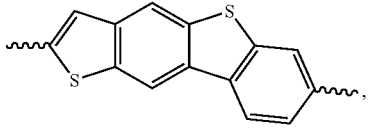

-continued
Structure 39
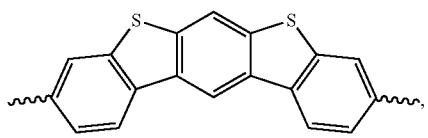
Structure 40
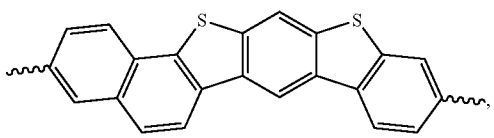
Structure 41
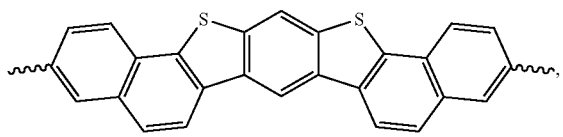
Structure 42
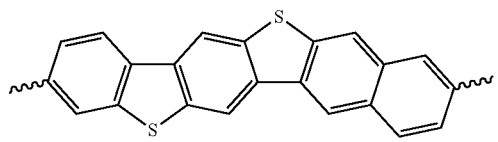
Structure 43
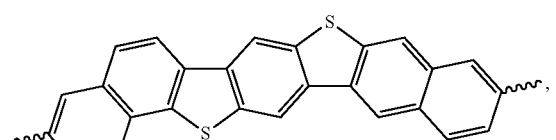
Structure 44
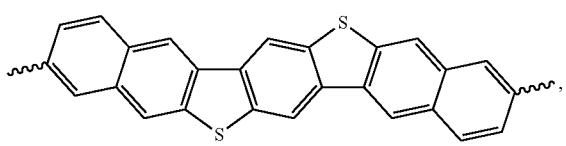
Structure 45
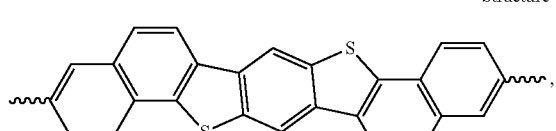
Structure 46
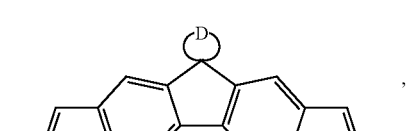
Structure 47
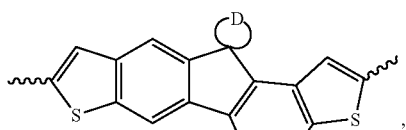
Structure 48
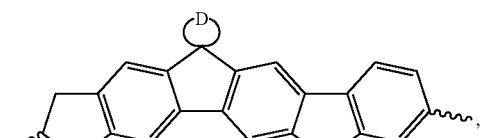
Structure 49
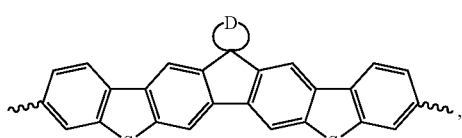
Structure 50
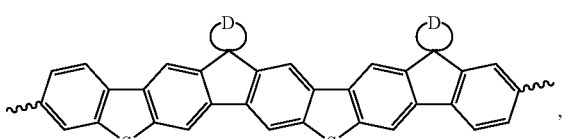
Structure 51
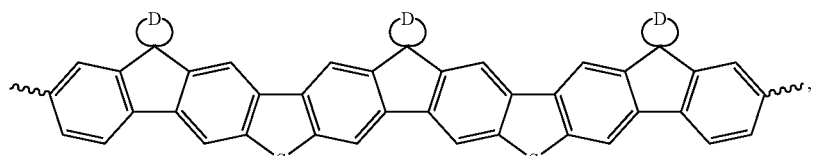
Structure 52
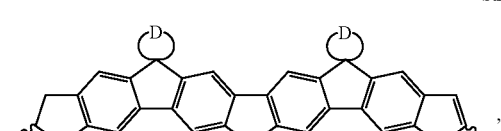
Structure 53
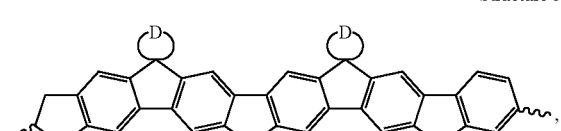
Structure 54
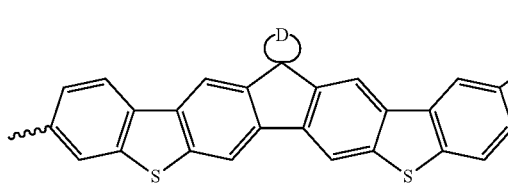
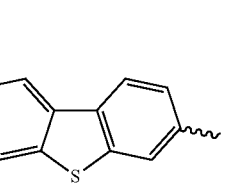

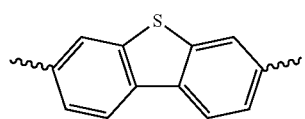

wherein the substituent

may be independently selected for each occurrence of this structure from one of the following spiro or bicyclospiro groups:

Structure 56
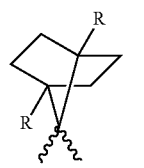

Structure 57
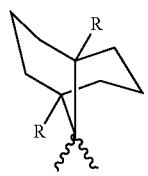

Structure 58
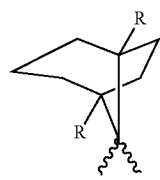

Structure 59
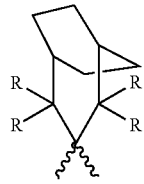

Structure 60
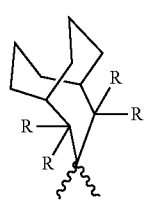

Structure 61
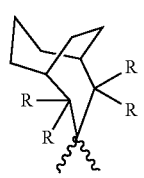

Structure 55
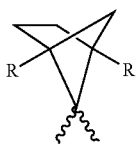

Structure 56
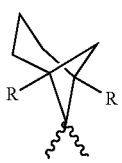

Structure 57
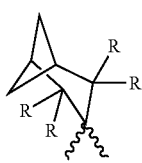

Structure 58
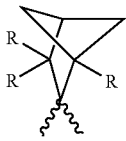

Structure 59
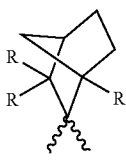

Structure 60
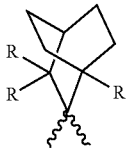

Structure 61
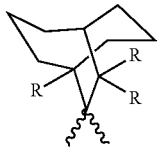

-continued

Structure 62

Structure 63

Structure 64

Structure 65

Structure 66

Structure 67

Structure 68

Structure 69
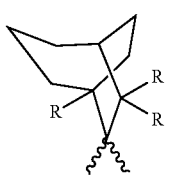

-continued

Structure 70
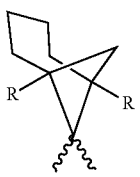

Structure 71
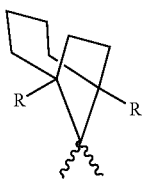

Structure 72
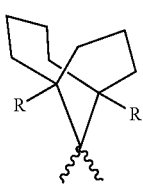

Structure 73
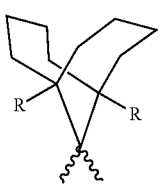

Structure 74
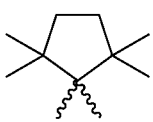

Structure 75
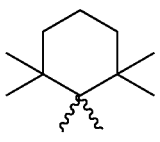

Structure 76
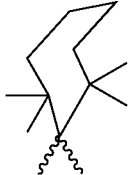

Structure 77
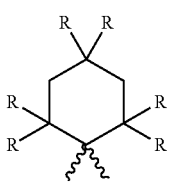

Structure 78
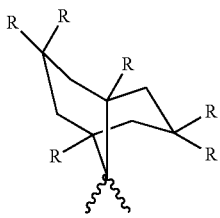

-continued

Structure 79
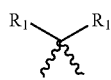

Structure 80
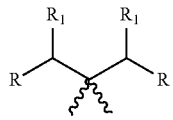

Structure 81
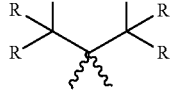

Structure 82
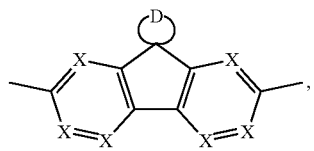

In these spirobicyclo and spiro substituents R is an alkyl group and may be chosen from methyl, ethyl, propyl, butyl, isopropyl, sec-butyl, isobutyl, tert-butyl, 2-amyl, 3-amyl, 2-methyl-2-butyl, 3-methyl-3-amyl, 3-ethyl-3-amyl, or neopentyl and $R_1$ independently in each occurrence may comprise branched, straight chain, or cyclic alkyl groups with 3 to 12 carbon atoms, which are unsubstituted, or mono- or polysubstituted by F, Cl, Br, I, or CN or wherein one or more nonadjacent $CH_2$ groups are replaced by —O—, —S—, —NH—, —NR—, —SiRR—, —CO—, —COO—, —OCO—, —OCO—O—, —S—CO—, —CO—S—, —CH=CH—, —C≡C— such that O and S atoms are not directly linked to other O or S atoms. Hydrogen atoms in structures 56 through 82 may be independently substituted by fluorine atoms. Ar in each occurrence in structure 2 may comprise and aromatic diradical, a heteroaromatic diradical, a single bond, or more than one of the above concatenated together in a substantially straight chain. In order to lower the melting point, to increase the liquid crystal phase stability, and to improve the solvent solubility of the inventive materials it is preferred that at least one Ar be chosen from the following diradicals:

Structure 83
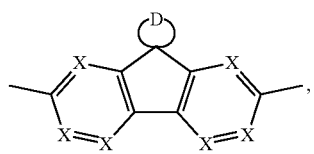

Structure 84

Structure 85
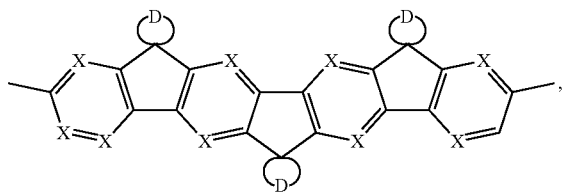

Structure 86
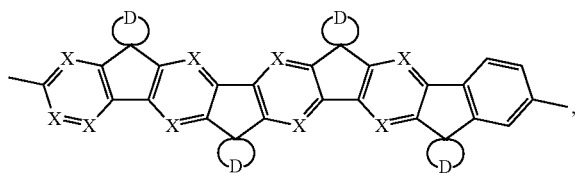

Structure 87
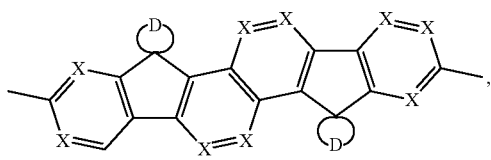

Structure 88
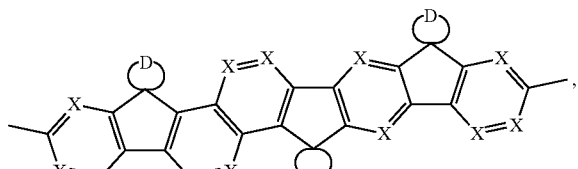

Structure 89
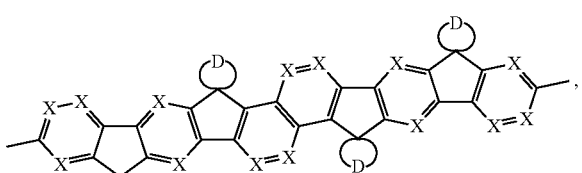

Structure 90
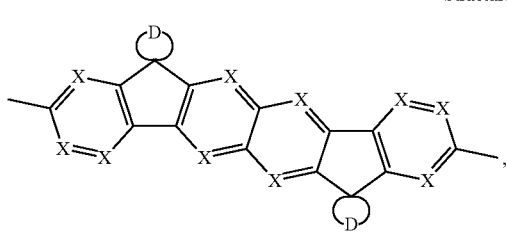

Structure 91
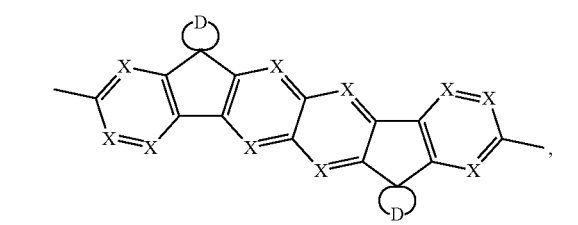

Structure 92
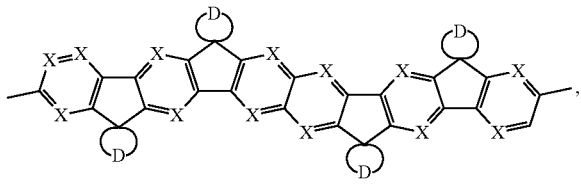

or

Structure 93
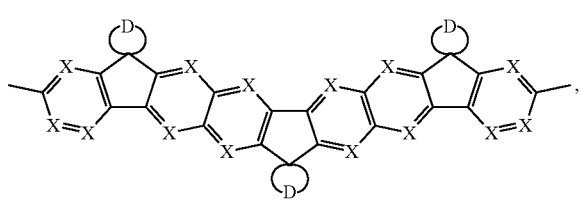

wherein X in each occurrence may be chosen from —CH— or —N—, and wherein the substituent

may be independently selected for each occurrence of this structure from one of structures 56 through 82 with R and $R_1$ having the same meanings as above.

It is most preferred that

is selected from structures 56 through 78. Ar may also comprise one of a 1,4-phenylene, a biphenyl-4,4'-diyl, a terphen-4,4"-diyl, a naphthalene-1,4-diyl, a thiophene-2,5-diyl, a pyrimidine-2,5-diyl, a perylene-3,10-diyl, a pyrene-2,7-diyl, a 2,2'-dithiophen-5,5'-diyl, an oxazole-2,5-diyl, a thieno[3,2-b]thiophene-2,5-diyl, a dithieno[3,2-b:2',3'-d]thiophene-2,6-diyl, a thiazolo[5,4-d]thiazole-2,5-diyl, an oxazolo[5,4-d]oxazole-2,5-diyl, a thiazolo[5,4-d]oxazole-2,5-diyl, a thiazolo[4,5-d]thiazole-2,5-diyl, an oxazolo[4,5-d]oxazole-2,5-diyl, a thiazolo[4,5-d]oxazole-2,5-diyl, 2,1,3-benzothiadiazol-4,7-diyl, or an imidazo[4,5-d]imidazole-2,5-diyl diradical, or a single bond. Ar and T units of the molecular core A may be concatenated together in a substantially linear fashion.

S in structure 1 may represent a flexible spacer comprising a chain of single bonded atoms. The chain may comprise an alkyl chain. The alkyl chain may contain one or more hetero atoms.

B may represent a crosslinking chemical group, which may be a methacrylate group, a 1,4-pentadien-3-yl group, an ethacrylate group, a vinyloxy group, an alkylvinyloxy group, an ethylmaleato group, an ethylfumarato group, an N-maleimido group, a vinylmaleato group, a vinylfumarato group, or a N-(2-vinyloxymaleimido) group.

In structure 2 the value of p is from 1 to 5. In structure one the values of n and m are independently selected from 1 to 3 and the substantially linear nature of the molecule is maintained.

When, in the condensed aromatic ring systems T, the thiophene rings are fused with one or more adjacent benzene rings, the presence of the benzene rings increases the chemical stability of these condensed ring systems at the same time that the two or more thiophene rings that are required to properly red shift the wavelength of the luminescent light output are present.

Example structures of these materials of the invention are:

Compound 1
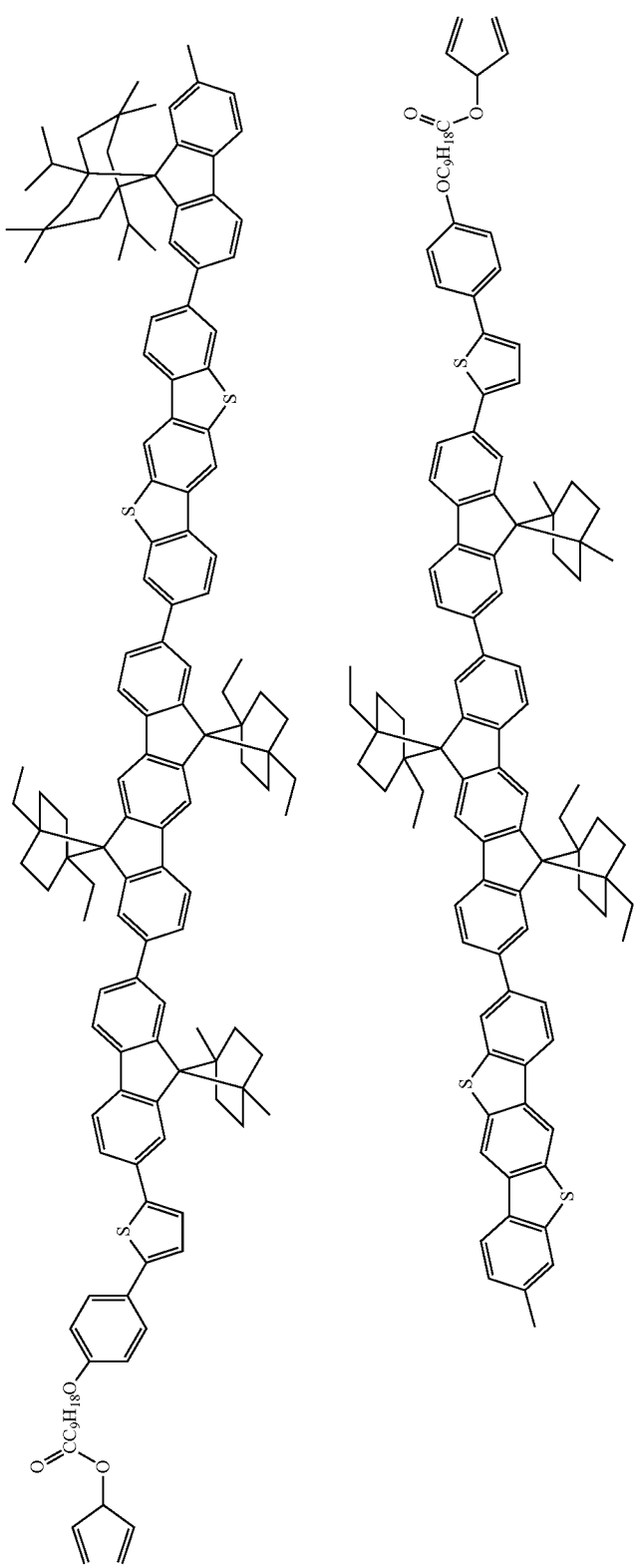

-continued
Compound 2
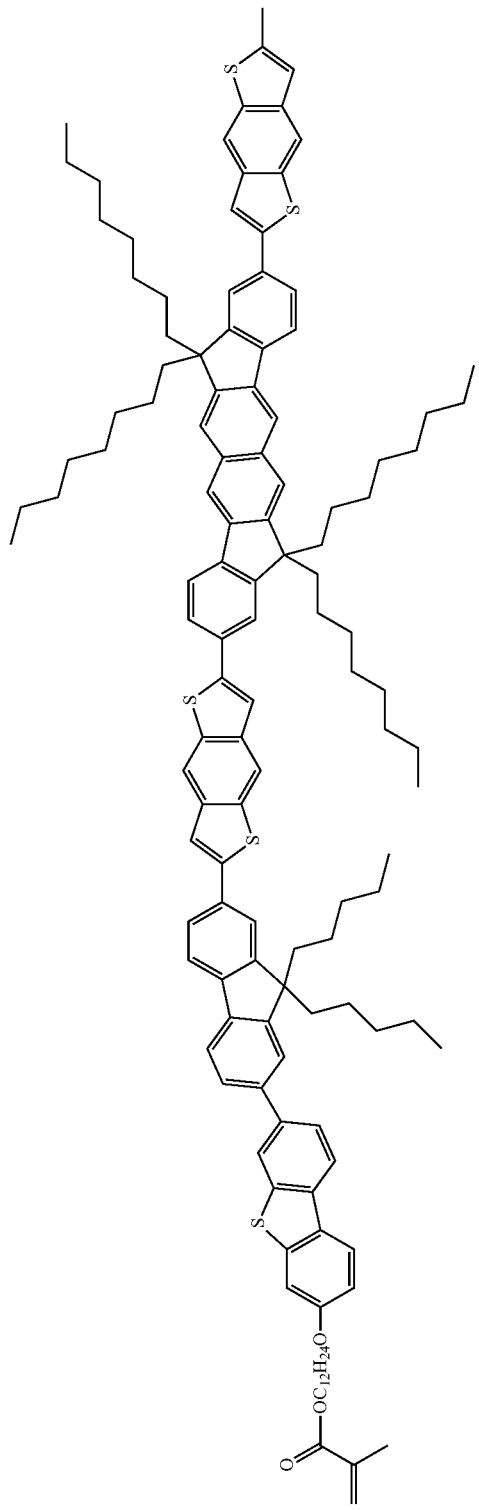
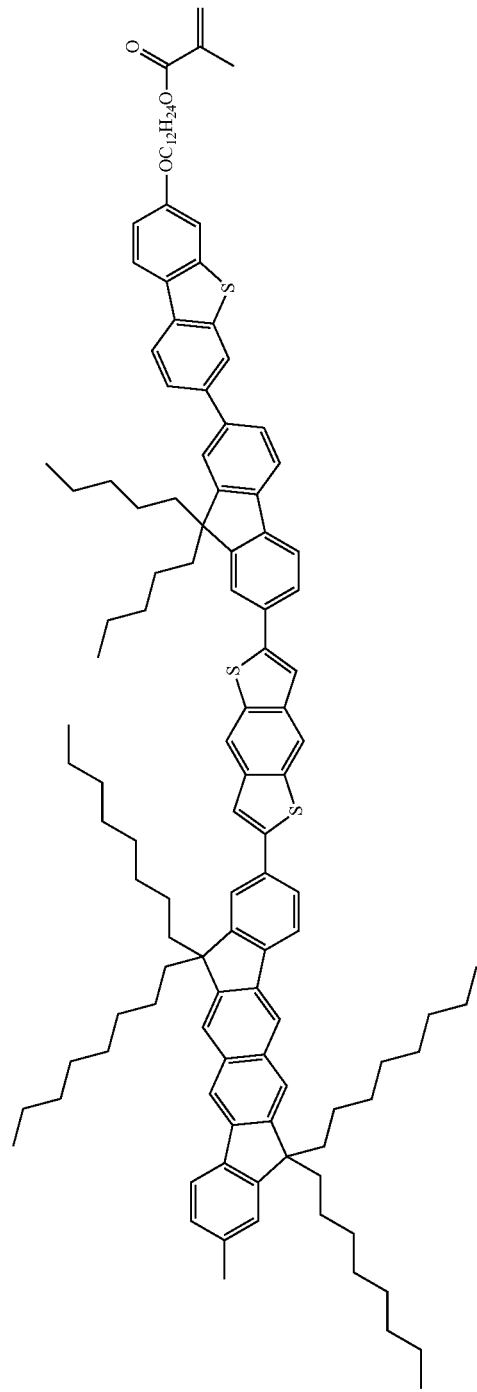

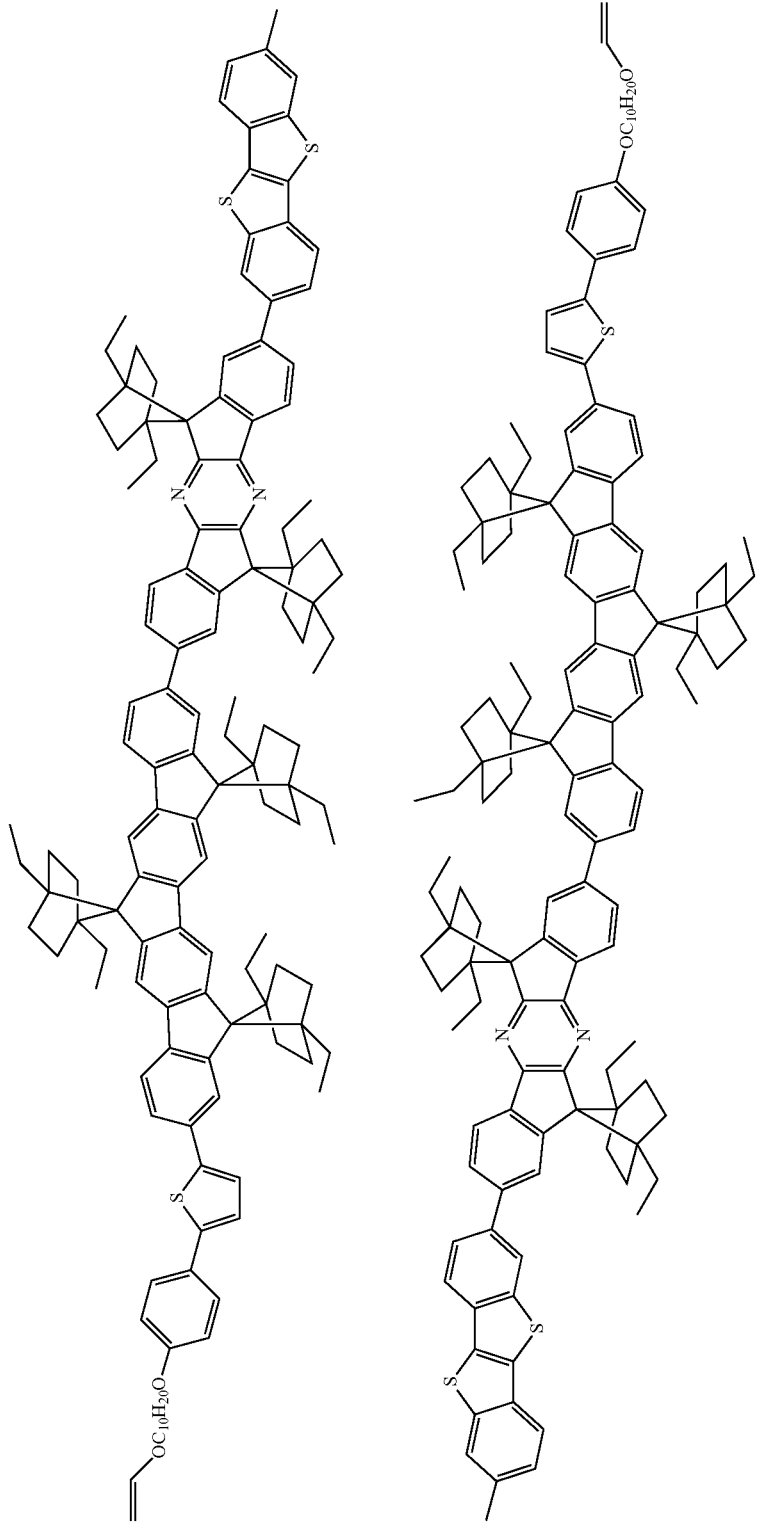
Compound 3

-continued
Compound 4
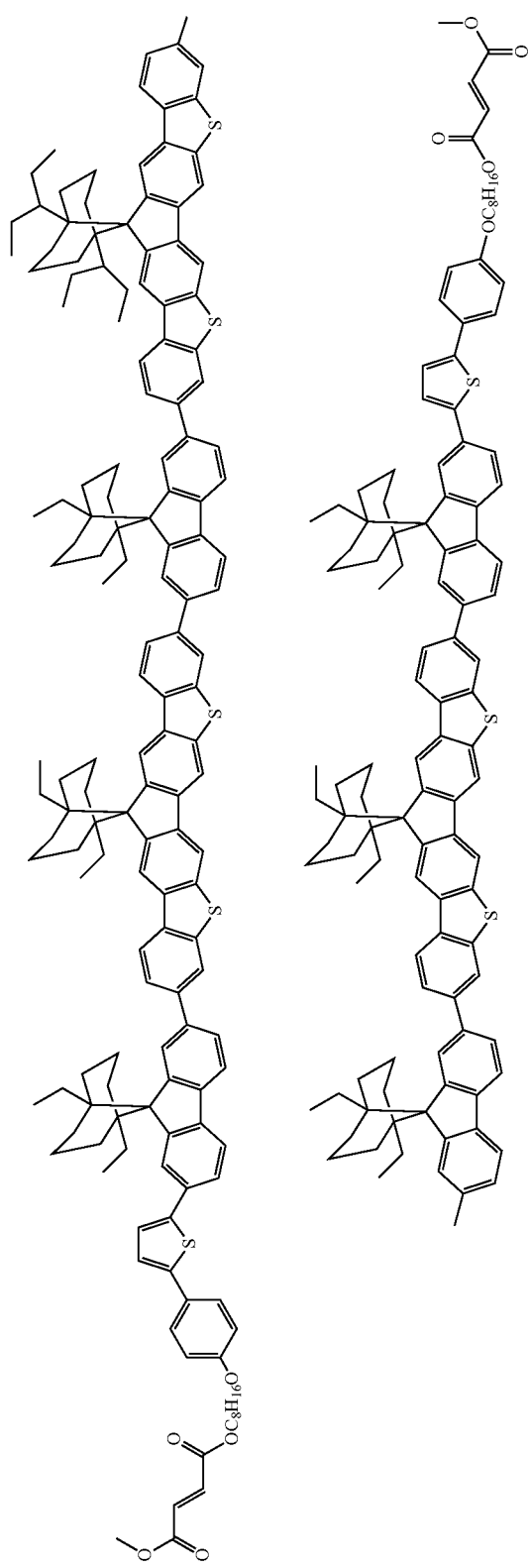

The invention claimed is:

1. An organic light emitting diode compound of the general structure:

(B-S-)$_n$-A-(-S-B)$_m$ wherein B is a crosslinking chemical group selected from the group consisting of a methacrylate group, a 1,4-pentadien-3-yl group, an ethacrylate group, a vinyloxy group, an alkylvinyloxy group, an ethylmaleato group, an ethylfumarato group, an N-maleimido group, a vinylmaleato group, a vinylfumarato group, or an N-(2-vinyloxymaleimido) group, S is a flexible spacer unit, n and m are independently selected from 1 to 3, and A is a linear aromatic molecular core described by the formula:

—Ar(-T-Ar)$_p$— wherein p is an integer from 1 to 5,

Ar in each occurrence is independently selected from the group consisting of an aromatic diradical, an heteroaromatic diradical, a single bond, and more than one of the above concatenated together in a straight chain, further wherein at least one Ar is selected from the group consisting of Structure 83
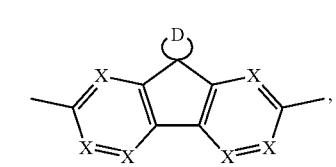

Structure 84
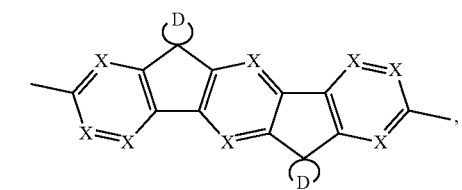

Structure 85
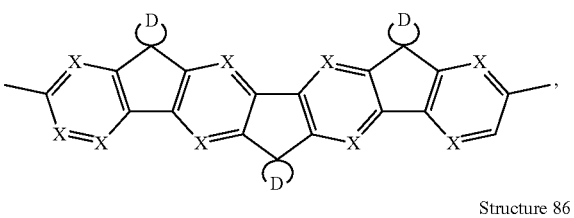

Structure 86
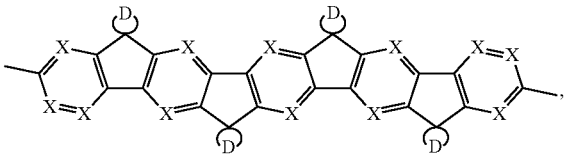

Structure 87
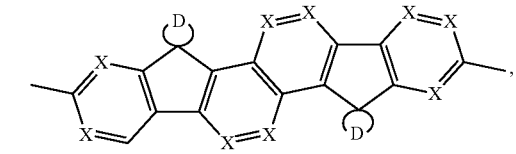

Structure 88
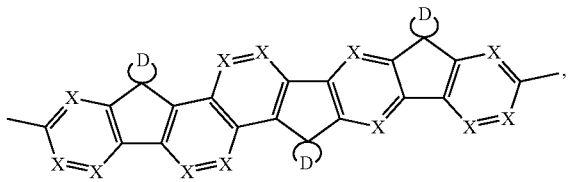

Structure 89
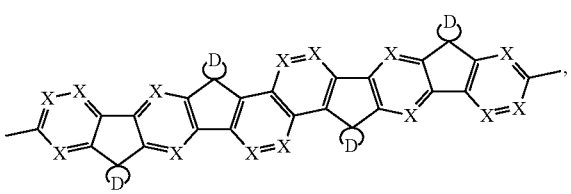

Structure 90
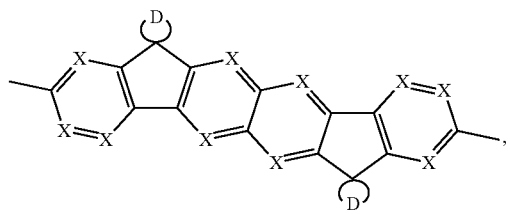

Structure 91
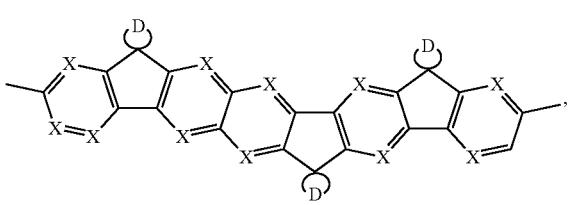

Structure 92
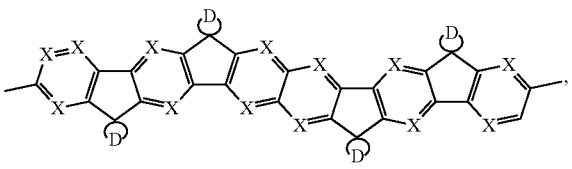

and

Structure 93
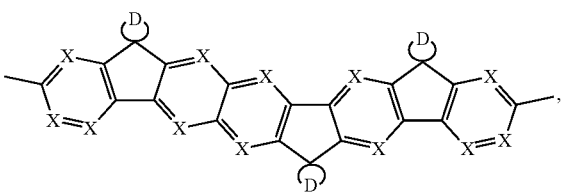

wherein X is —CH— or —N—, and wherein T is selected from the group consisting of Structure 3
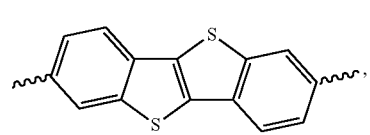

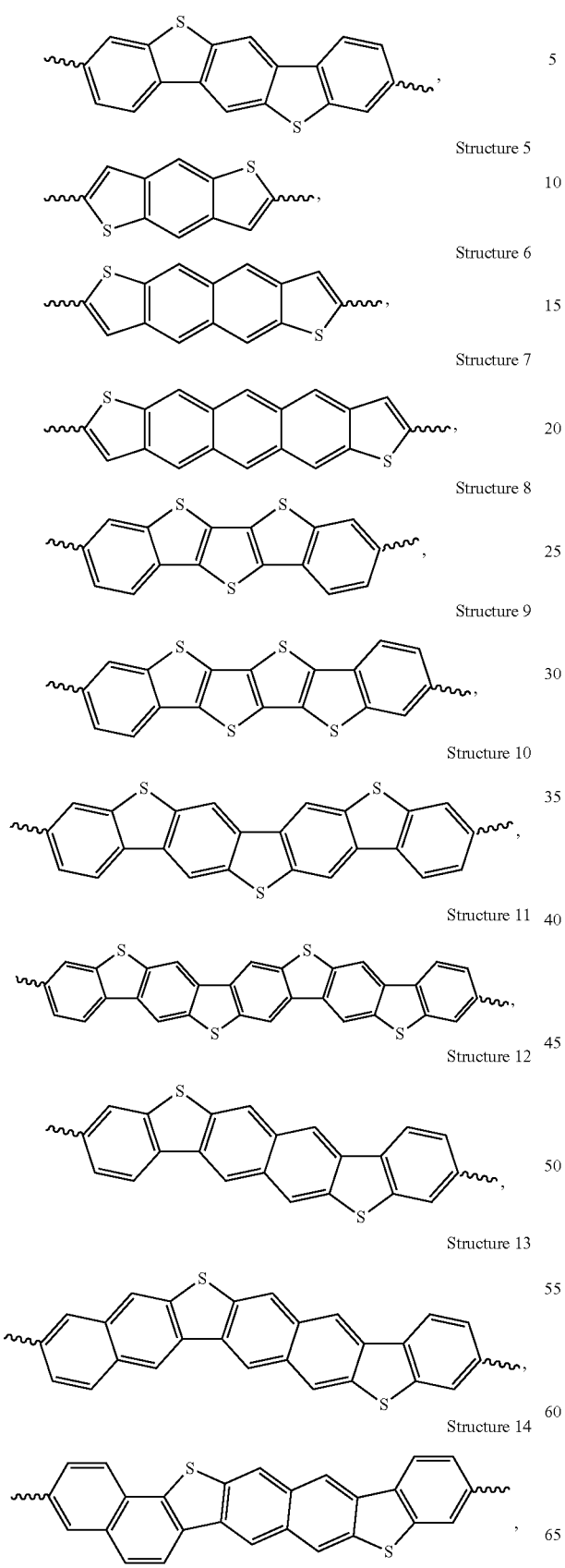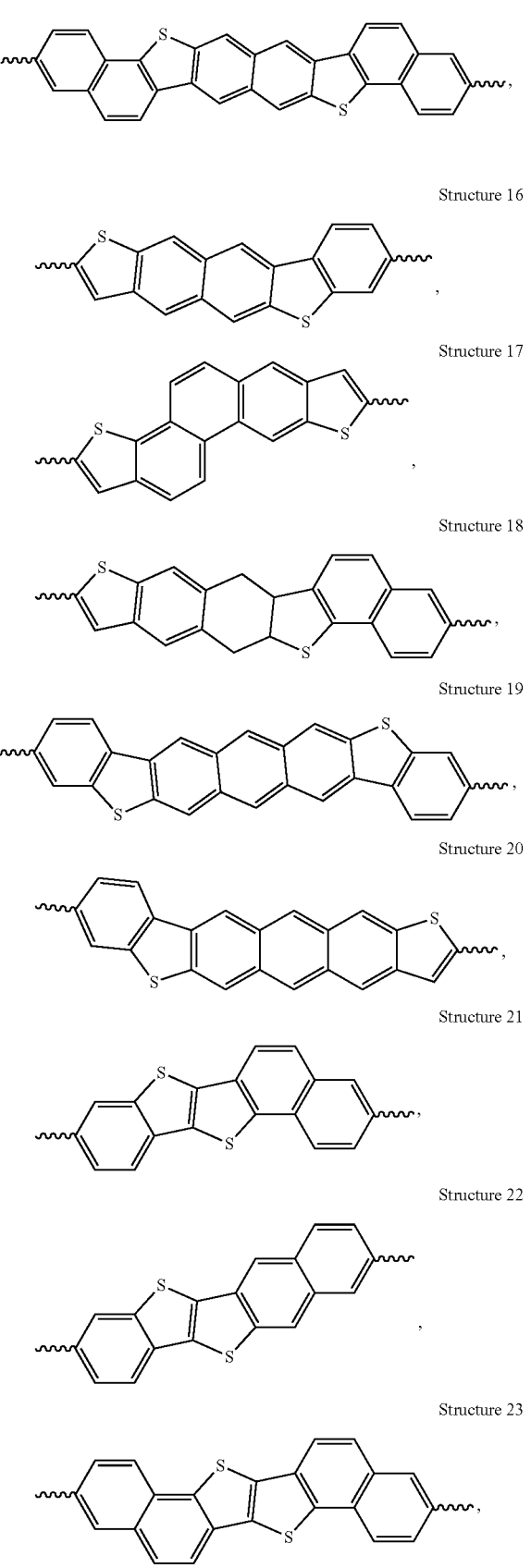

Structure 24
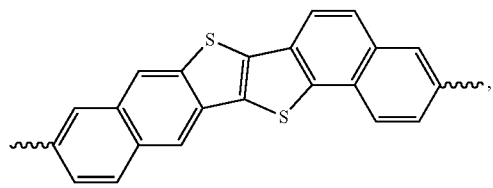
Structure 25
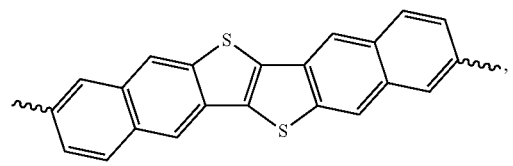
Structure 26
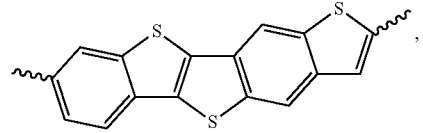
Structure 27
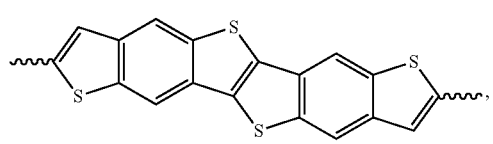
Structure 28
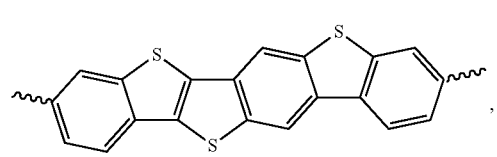
Structure 29
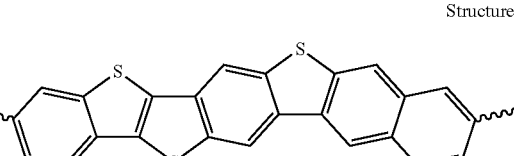
Structure 30
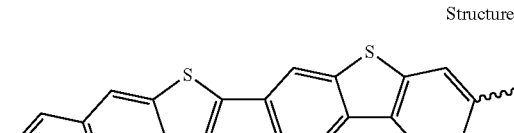
Structure 31
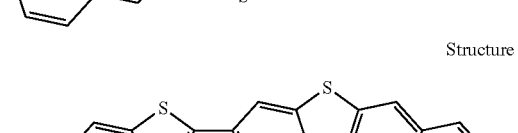
Structure 32
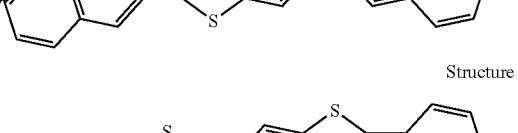
Structure 33
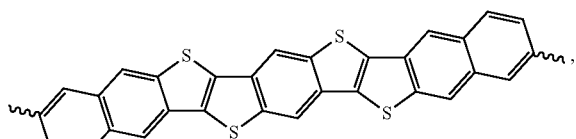
Structure 34
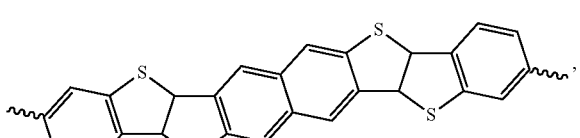
Structure 35
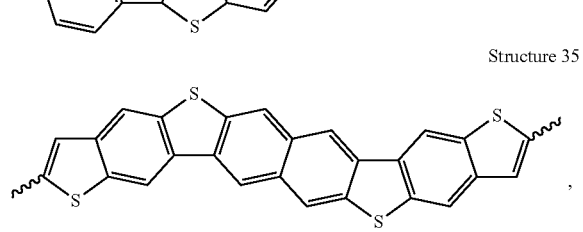
Structure 36
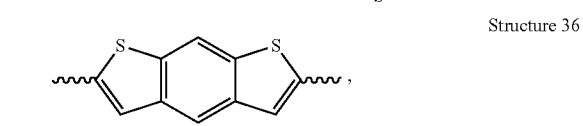
Structure 37
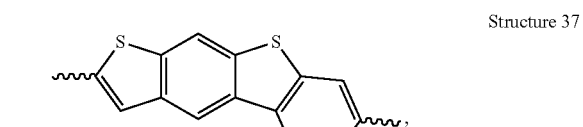
Structure 38
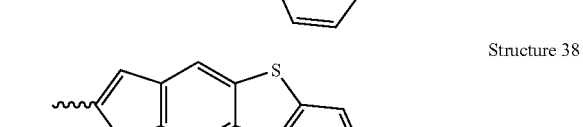
Structure 39
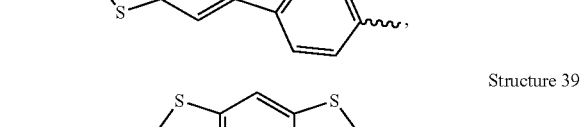
Structure 40
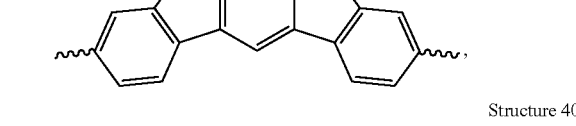
Structure 41
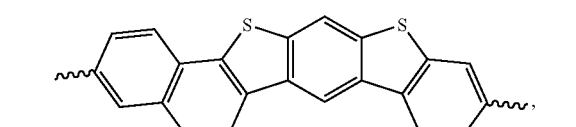
Structure 42
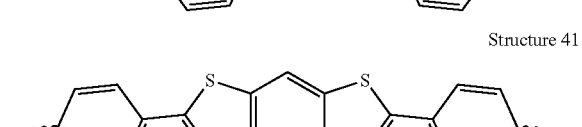

-continued
Structure 43
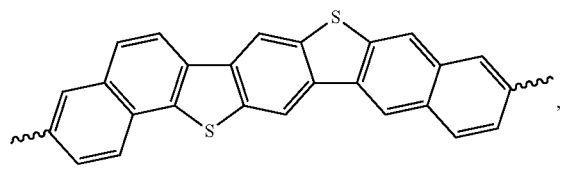
Structure 44
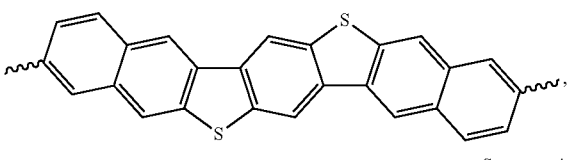
Structure 45
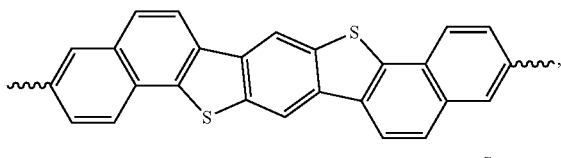
Structure 46
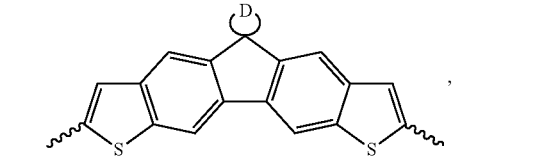
Structure 47
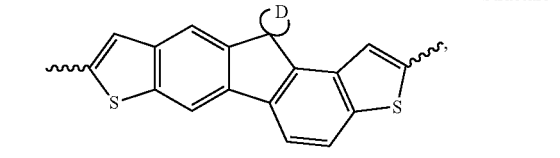
Structure 48
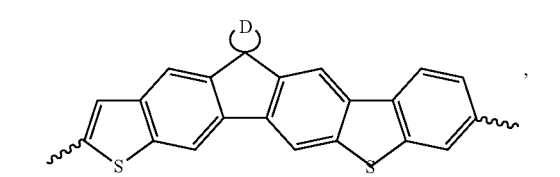
Structure 49
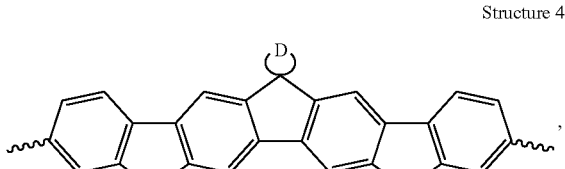
Structure 50
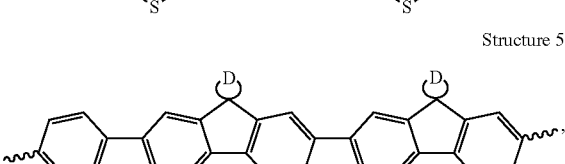
Structure 51
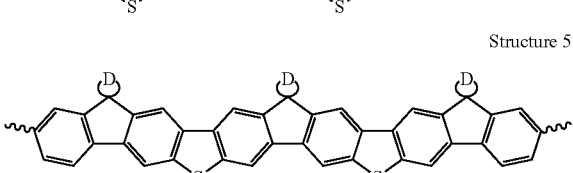
-continued
Structure 52
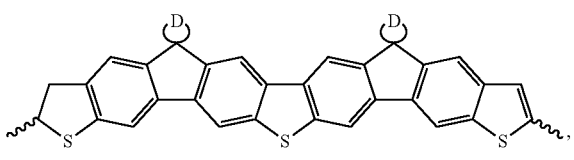
Structure 53
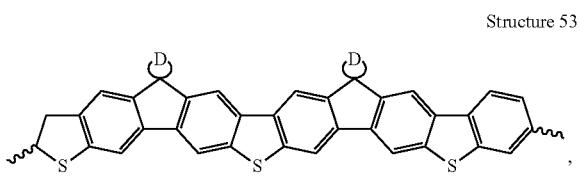
Structure 54
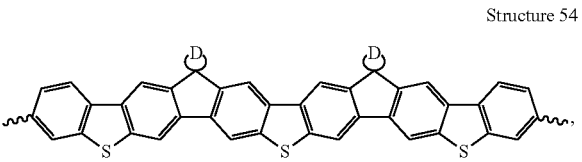
and
Structure 55
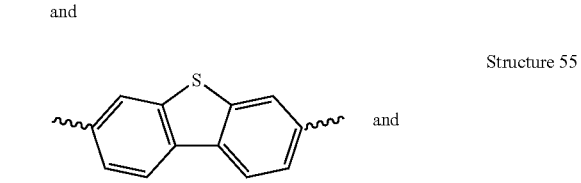
and
wherein
is selected from the group consisting of
Structure 56
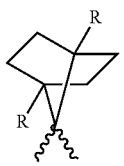
Structure 57
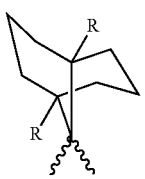
Structure 58
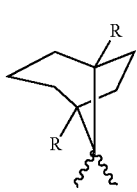

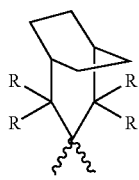
Structure 59
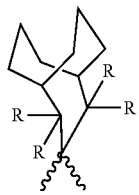
Structure 60
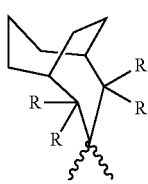
Structure 61
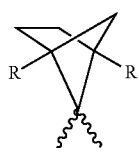
Structure 62
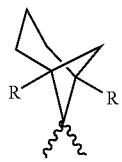
Structure 63
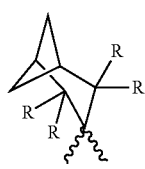
Structure 64
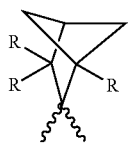
Structure 65
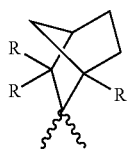
Structure 66
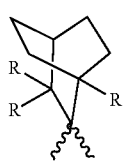
Structure 67
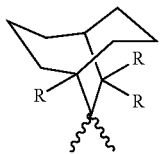
Structure 68
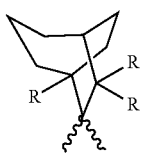
Structure 69
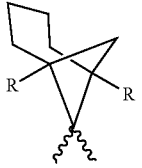
Structure 70
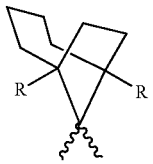
Structure 71
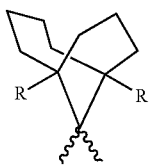
Structure 72
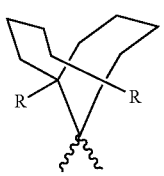
Structure 73
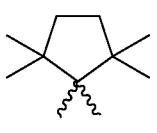
Structure 74
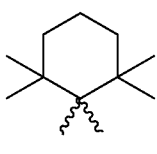
Structure 75

Structure 76

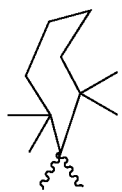

Structure 77

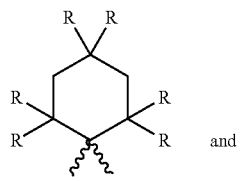 and

Structure 78

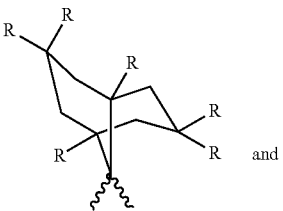 and wherein R is an alkyl group and $R^1$ is a branched, straight chain, or cyclic alkyl group with 3 to 12 carbon atoms, which are unsubstituted, or mono- or poly-substituted by F, Cl, Br, I or CN.

2. The compound of claim 1, wherein T is selected from the group consisting of Structure 46

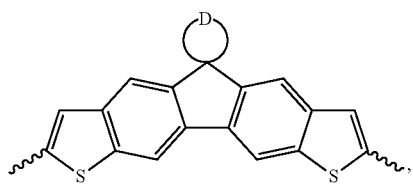

Structure 47

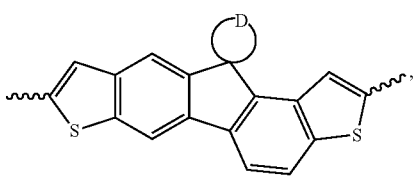

Structure 48

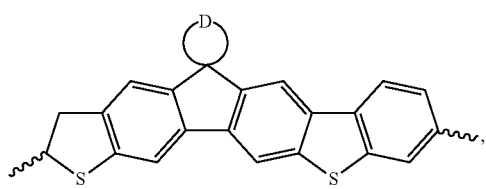

Structure 49

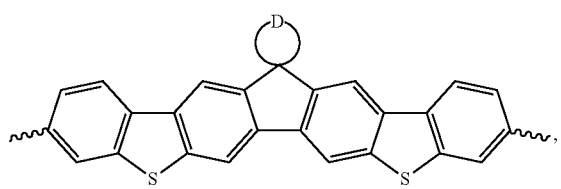

Structure 50

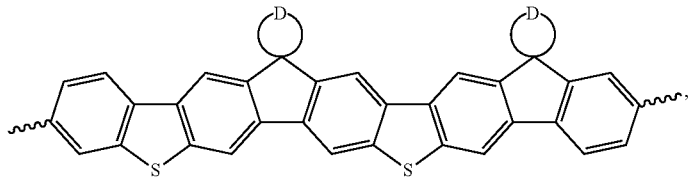

Structure 51

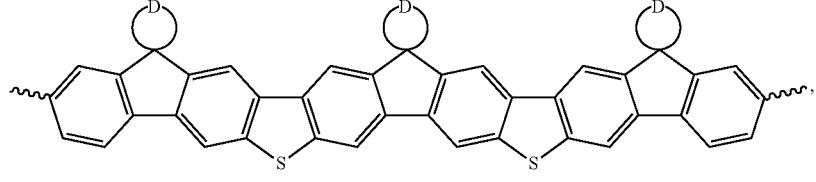

Structure 52

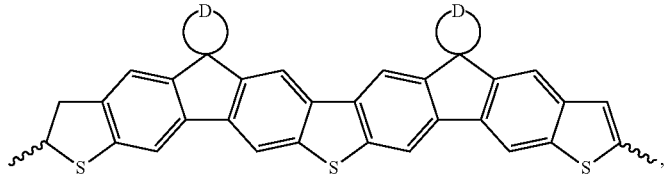

Structure 53

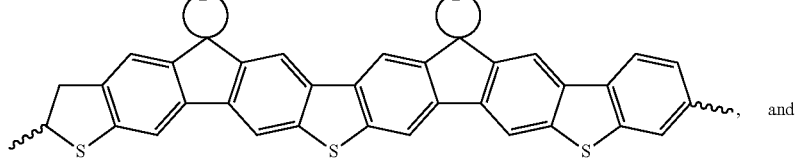 and

-continued
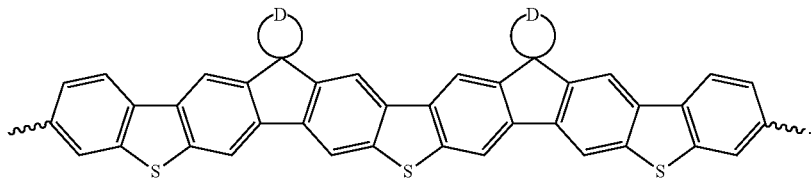
Structure 54
3. The compound of claim 1, wherein T is selected from the group consisting of
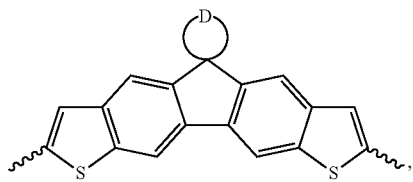
Structure 46
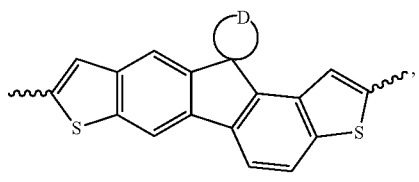
Structure 47
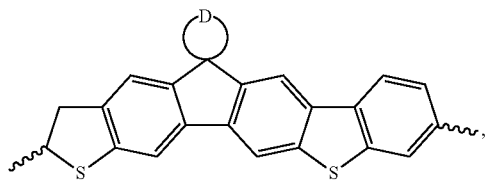
Structure 48
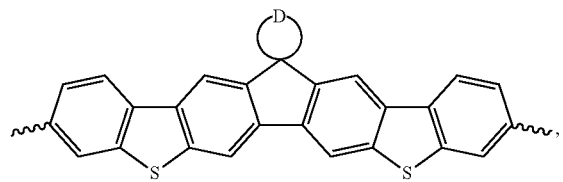
Structure 49
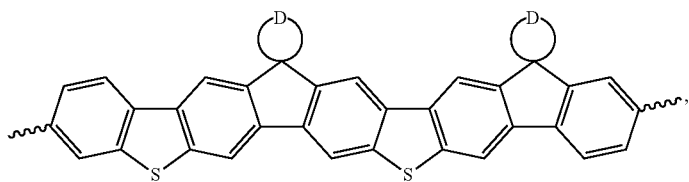
Structure 50
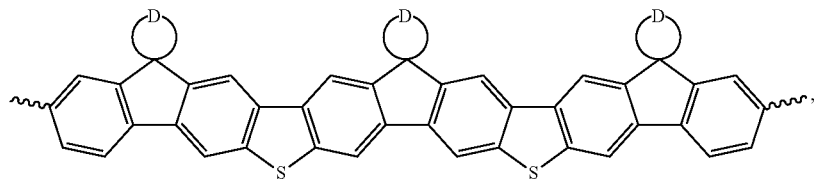
Structure 51
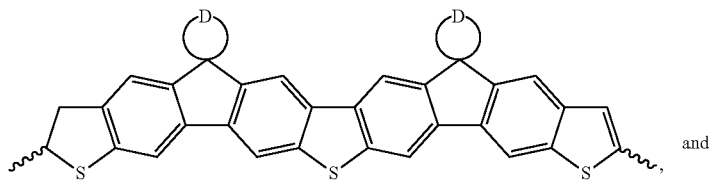
Structure 52
and
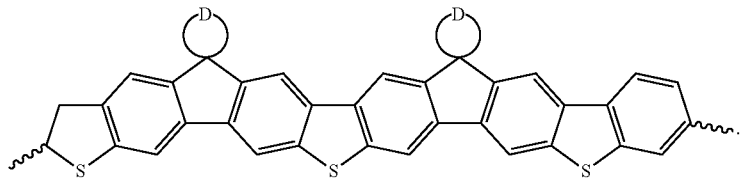
Structure 53

4. The compound of claim 1, wherein R is selected from the group consisting of methyl, ethyl, propyl, butyl, isopropyl, sec-butyl, iso-butyl, tert-butyl, 2-amyl, 3-amyl, 2-methyl-2-butyl, 3-methyl-3-amyl, 3-ethyl-3-amyl, and neo-pentyl.

5. The compound of claim 4, wherein at least one $CH_2$ group is replaced by —O—, —S—, —NH—, —SiRR—, —CO—, —COO—, —OCO—, —OCO—O—, —S—CO—, —CO—S—, —CH=CH—, or —C≡C— such that O and S atoms are not directly linked to other O or S atoms.

6. The compound of claim 1, wherein at least one hydrogen atom in the group

is replaced by a fluorine atom.

7. The compound of claim 1, wherein in instances where Ar is not selected from structures 83 to 93, Ar is selected from the group consisting of 1,4-phenylene, a biphenyl-4,4'-diyl, a terphen-4,4''-diyl, a naphthalene-1,4-diyl, a thiophene-2,5-diyl, a pyrimidine-2,5-diyl, a perylene-3,10-diyl, a pyrene-2,7-diyl, a 2,2'-dithiophen-5,5'-diyl, an oxazole-2,5-diyl, a thieno[3,2-b]thiophene-2,5-diyl, a dithieno[3,2-b:2',3'-d]thiophene-2,6-diyl, a thiazolo[5,4-d]thiazole-2,5-diyl, an oxazolo[5,4-d]oxazole-2,5-diyl, a thiazolo[5,4-d]oxazole-2,5-diyl, a thiazolo[4,5-d]thiazole-2,5-diyl, an oxazolo[4,5-d]oxazole-2,5-diyl, a thiazolo[4,5-d]oxazole-2,5-diyl, 2,1,3-benzothiadiazol-4,7-diyl, imidazo[4,5-d]imidazole-2,5-diyl diradical and a single bond.

8. The compound of claim 1, wherein S is a flexible spacer comprising a chain of single bonded atoms.

9. The compound of claim 1, wherein the alkyl groups are selected from unsubstituted groups, mono-substituted groups and poly-substituted groups in which the substituents are selected from F, Cl, Br, I, or CN.

10. The compound of claim 5, wherein if more than one $CH_2$ group is replaced, the replaced groups are non-adjacent.

11. An organic light emitting diode compound of the general structure:

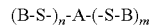

wherein B is a crosslinking chemical group selected from the group consisting of a methacrylate group, a 1,4-pentadien-3-yl group, an ethacrylate group, a vinyloxy group, an alkylvinyloxy group, an ethylmaleato group, an ethylfumarato group, an N-maleimido group, a vinylmaleato group, a vinylfumarato group, or an N-(2-vinyloxymaleimido) group, S is a flexible spacer unit, n and m are independently selected from 1 to 3, and A is a linear aromatic molecular core described by the formula:

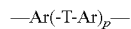

wherein p is an integer from 1 to 5,

Ar in each occurrence is independently selected from the group consisting of an aromatic diradical, an heteroaromatic diradical, a single bond, and more than one of the above concatenated together in a straight chain, further wherein at least one Ar is selected from the group consisting of Structure 83

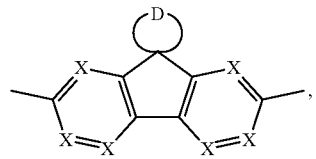

Structure 84

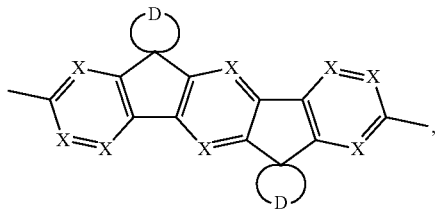

Structure 85

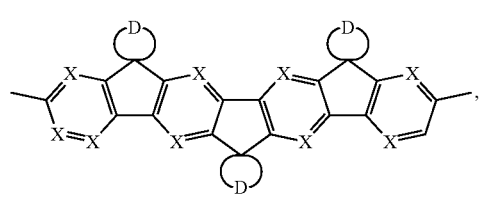

Structure 86

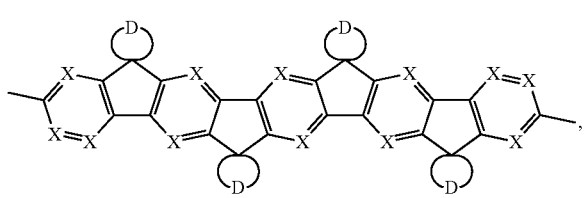

Structure 87

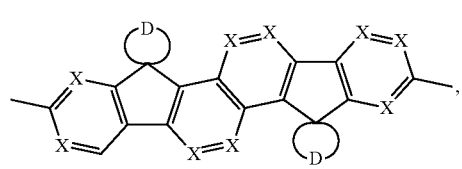

Structure 88

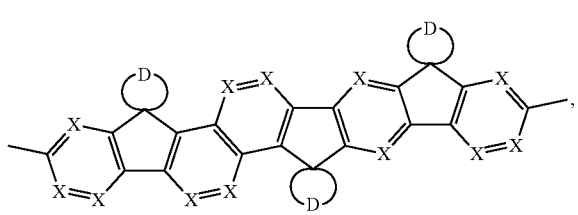

-continued
Structure 89
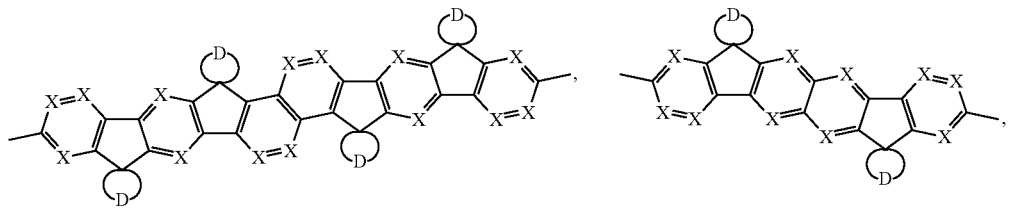
Structure 90
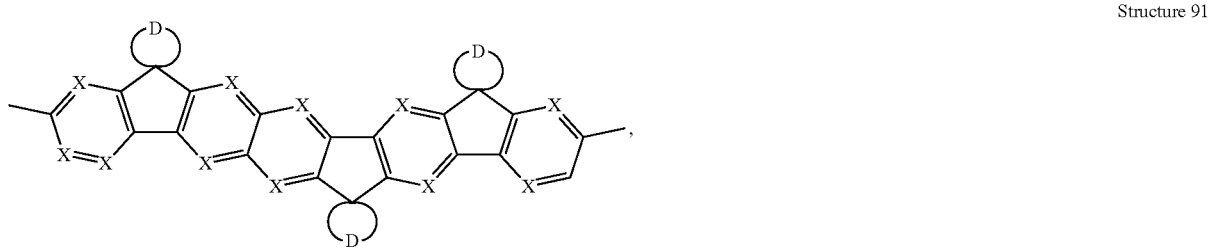
Structure 91
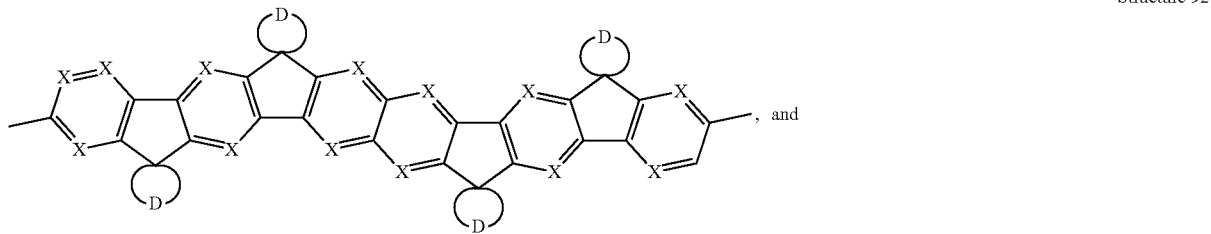
Structure 92
, and
Structure 93
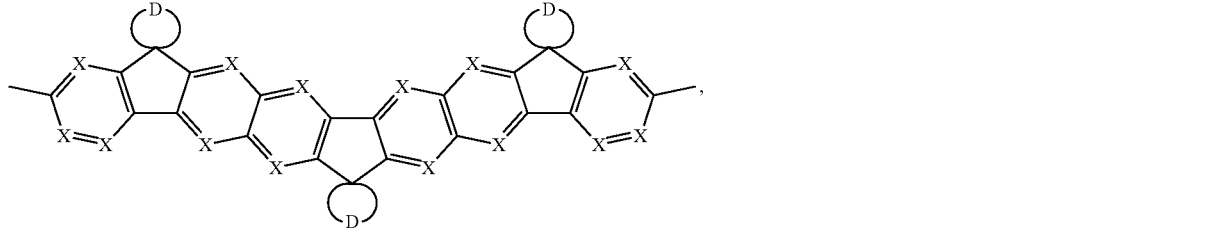
wherein X is —CH— or —N—, and
wherein T is selected from the group consisting of
Structure 4
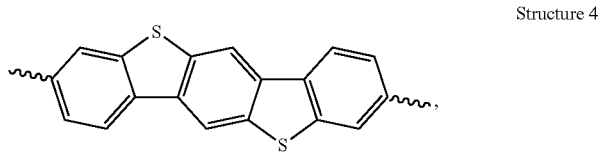
Structure 6
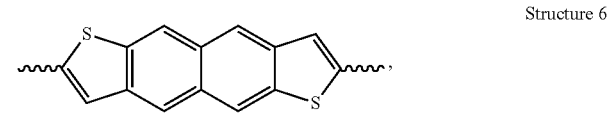
Structure 8
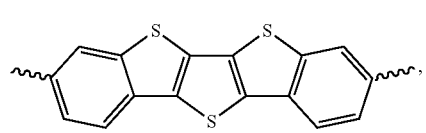
Structure 9
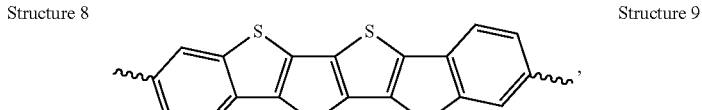
Structure 10
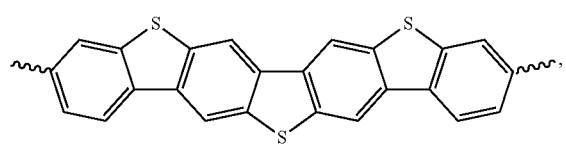
Structure 11
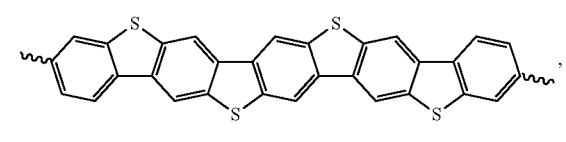

-continued
Structure 12
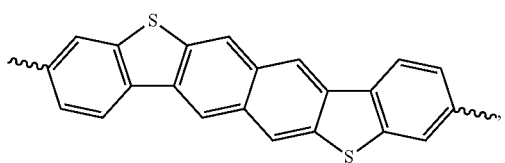
Structure 13
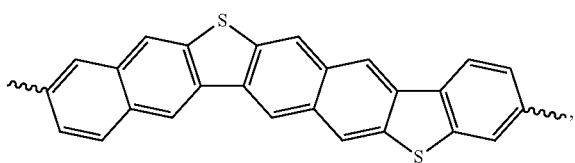
Structure 14
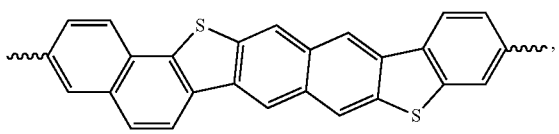
Structure 15
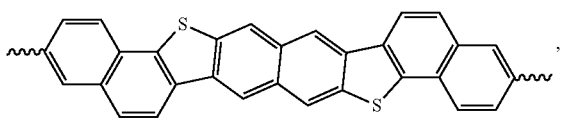
Structure 16
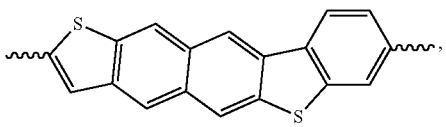
Structure 17
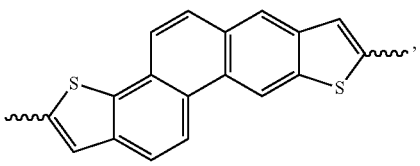
Structure 18
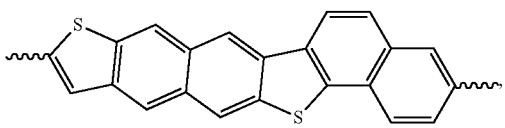
Structure 19
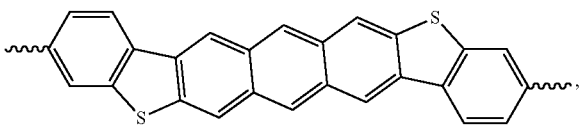
Structure 20
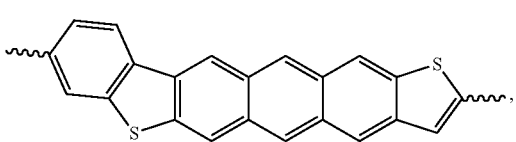
Structure 21
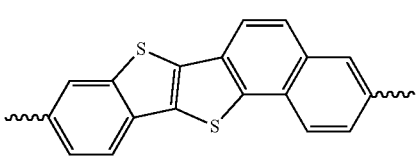
Structure 22
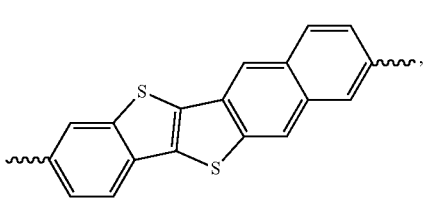
Structure 23
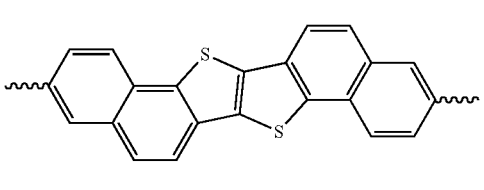
Structure 24
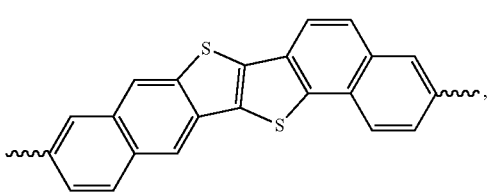
Structure 26
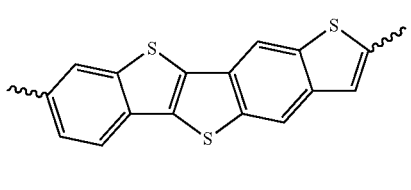
Structure 27
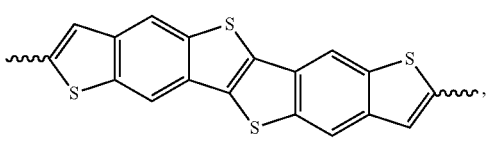
Structure 28
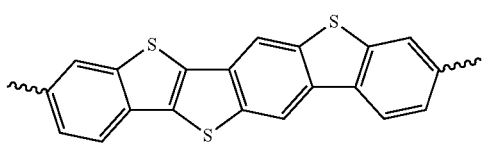
Structure 29
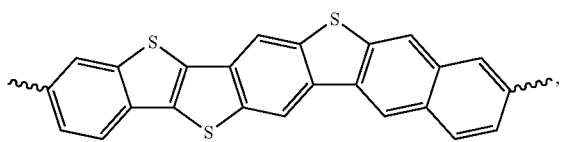
Structure 30
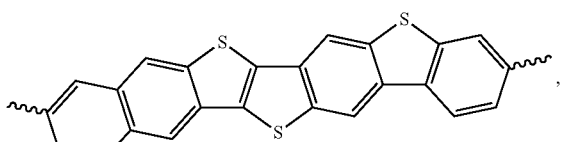

-continued
Structure 31
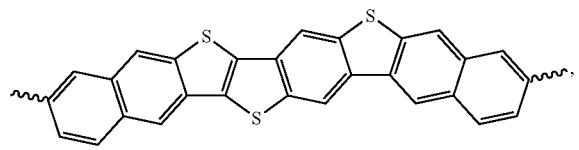
Structure 32
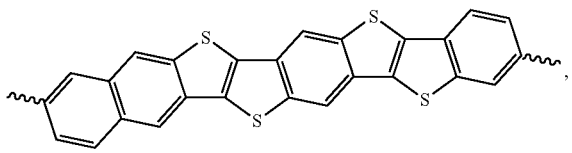
Structure 33
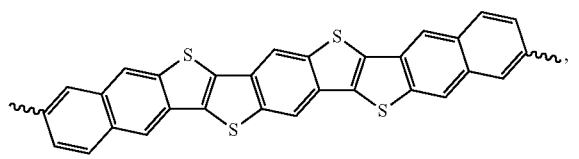
Structure 34
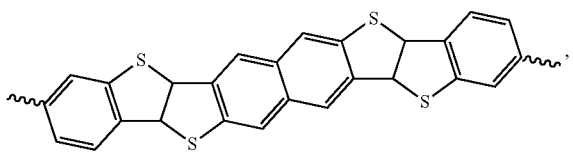
Structure 35
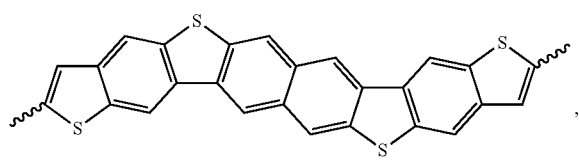
Structure 36
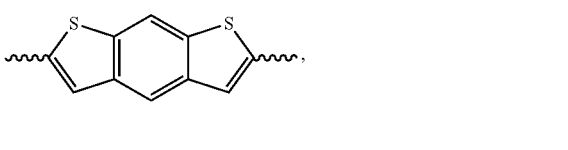
Structure 37
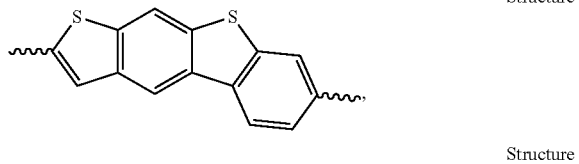
Structure 38
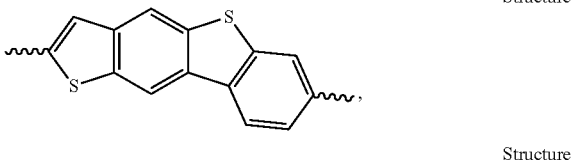
Structure 39
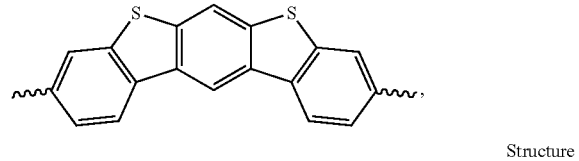
Structure 40
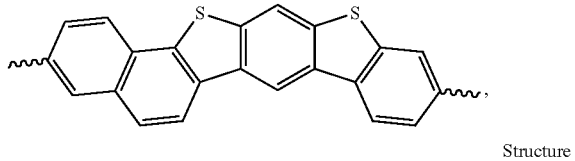
Structure 41
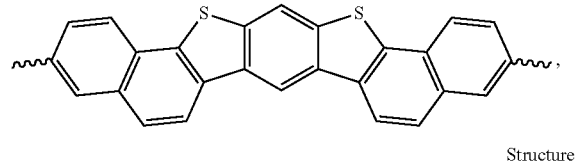
Structure 42
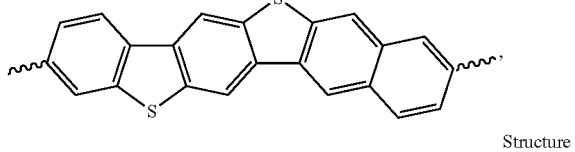
Structure 43
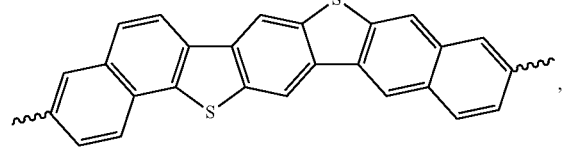
Structure 44
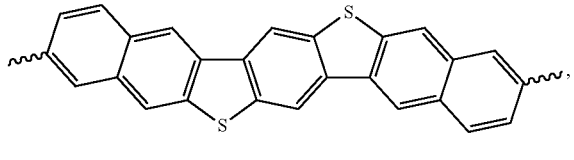
Structure 45
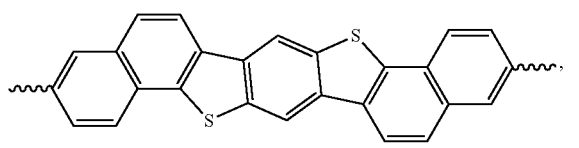
Structure 46
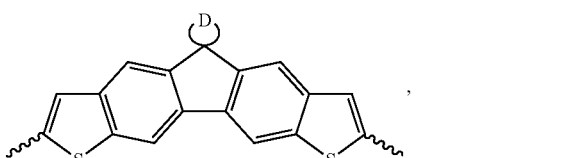
Structure 47
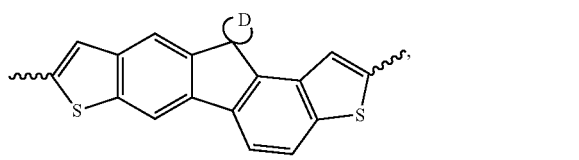
Structure 48
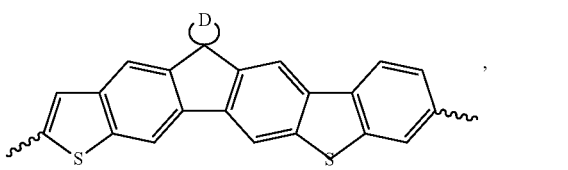

-continued
Structure 49
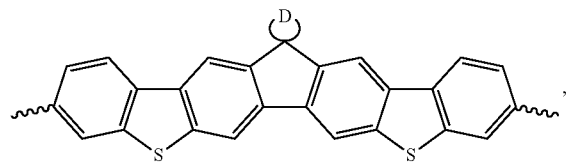
Structure 50
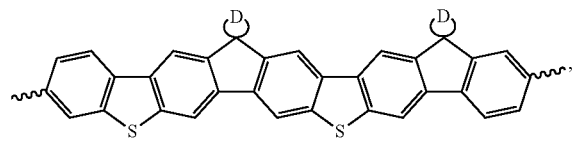
Structure 51
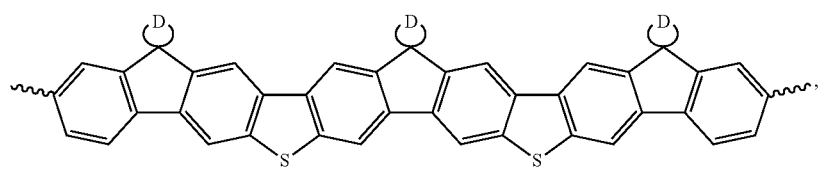
Structure 52
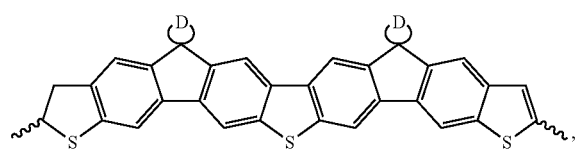
Structure 53
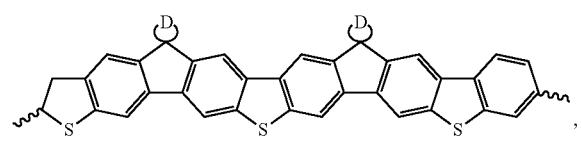
Structure 54
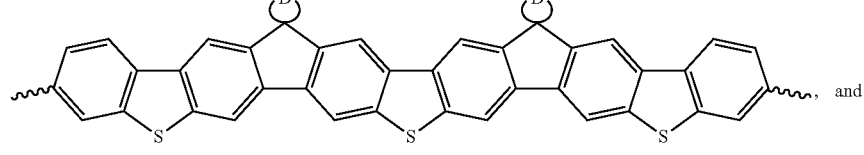, and
Structure 55
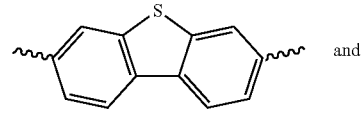 and
wherein
is selected from the group consisting of spiro and bicyclospiro groups.
12. The compound of claim 11, wherein
is selected from the group consisting of
Structure 56
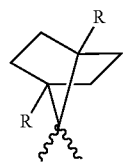
-continued
Structure 57
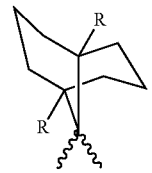
Structure 58
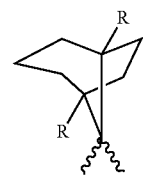
Structure 59
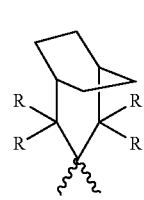

Structure 60
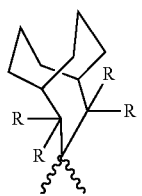
Structure 61
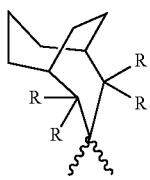
Structure 62
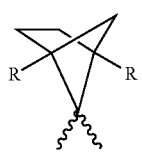
Structure 63
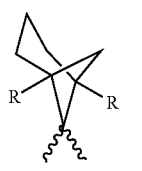
Structure 64
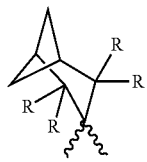
Structure 65
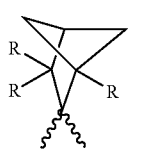
Structure 66
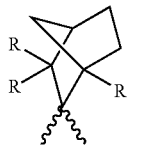
Structure 67
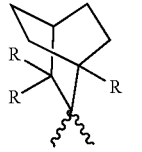
Structure 68
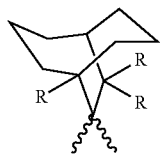
Structure 69
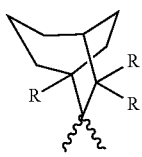
Structure 70
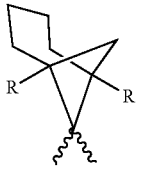
Structure 71
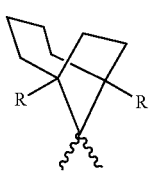
Structure 72
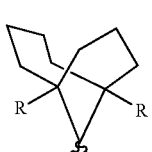
Structure 73
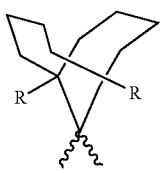
Structure 74
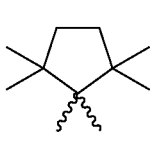
Structure 75
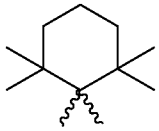
Structure 76
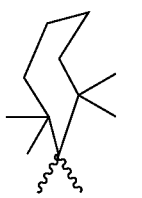
Structure 77
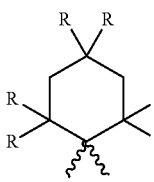

Structure 78

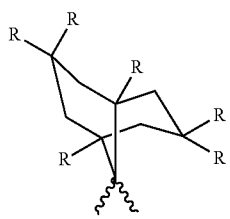

Structure 79

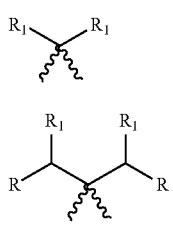

Structure 80

Structure 81

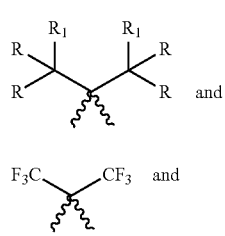
and

Structure 82

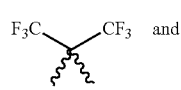
and wherein R is an alkyl group and $R^1$ is a branched, straight chain, or cyclic alkyl group with 3 to 12 carbon atoms, which are unsubstituted, or mono- or poly-substituted by F, Cl, Br, I or CN.

13. The compound of claim 11, wherein T is selected from the group consisting of Structure 46

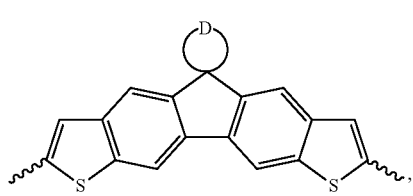

Structure 47

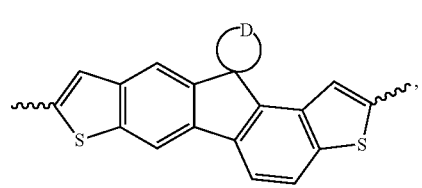

Structure 48

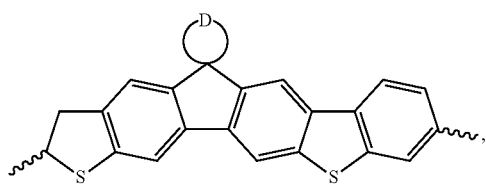

Structure 49

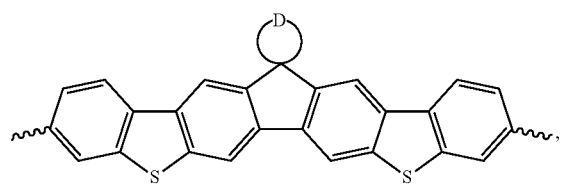

Structure 50

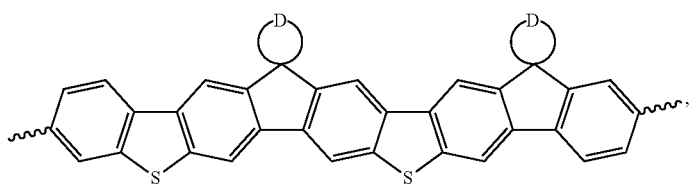

Structure 51

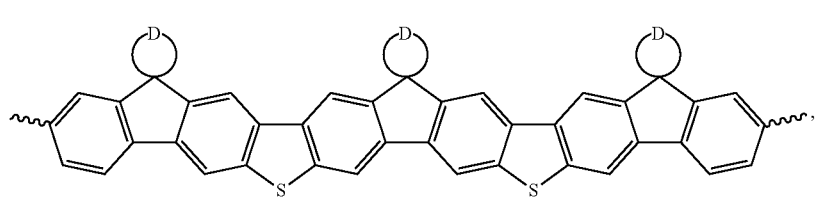

Structure 52

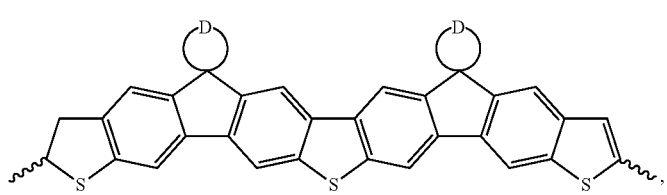

-continued

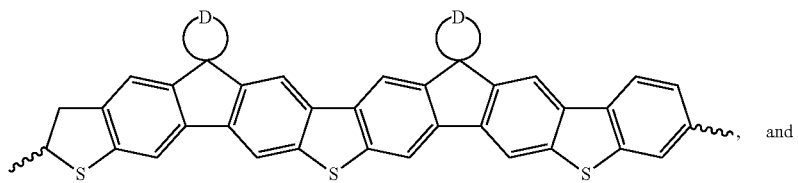

Structure 53

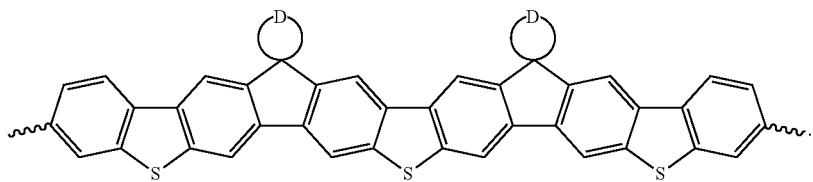

Structure 54

14. The compound of claim 12, wherein R is selected from the group consisting of methyl, ethyl, propyl, butyl, isopropyl, sec-butyl, iso-butyl, tert-butyl, 2-amyl, 3-amyl, 2-methyl-2-butyl, 3-methyl-3-amyl, 3-ethyl-3-amyl, and neo-pentyl.

15. The compound of claim 14, wherein at least one CH$_2$ group is replaced by —O—, —S—, —NH—, —SiRR—, —CO—, —COO—, —OCO—, —OCO—O—, —S—CO—, —CO—S—, —CH=CH—, or —C≡C— such that O and S atoms are not directly linked to other O or S atoms.

16. The compound of claim 12, wherein the alkyl groups are selected from unsubstituted groups, mono-substituted groups and poly-substituted groups in which the substituents are selected from F, Cl, Br, I, or CN.

17. The compound of claim 11, wherein S is a flexible spacer comprising a chain of single bonded atoms.

18. The compound of claim 11, wherein at least one hydrogen atom in the group

is replaced by a fluorine atom.

* * * * *